(12) United States Patent
Uchiyama et al.

(10) Patent No.: US 8,169,072 B2
(45) Date of Patent: May 1, 2012

(54) SEMICONDUCTOR DEVICE, MANUFACTURING METHOD THEREOF, AND ELECTRONIC DEVICE

(75) Inventors: Kenta Uchiyama, Nagano (JP); Akihiko Tateiwa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 173 days.

(21) Appl. No.: 12/748,545

(22) Filed: Mar. 29, 2010

(65) Prior Publication Data

US 2010/0258946 A1 Oct. 14, 2010

(30) Foreign Application Priority Data

Apr. 10, 2009 (JP) ................... 2009-096024

(51) Int. Cl.
*H01L 23/053* (2006.01)
*H01L 23/12* (2006.01)
(52) U.S. Cl. ................ 257/700; 257/E23.174; 257/687; 257/723; 257/773; 438/107; 438/122; 361/761
(58) Field of Classification Search ........... 257/E21.502, 257/E23.174, 668, 685, 680, 673, 679, 782, 257/758, 700, 701, 723, 774, E23.02, E21.585, 257/773, 687; 438/124, 107, 113, 114, 122, 438/667; 174/260, 262, 535; 29/840; 361/761, 361/763, 783
See application file for complete search history.

(56) References Cited

U.S. PATENT DOCUMENTS

| | | | | |
|---|---|---|---|---|
| 6,013,948 A * | 1/2000 | Akram et al. | ................. | 257/698 |
| 6,159,767 A * | 12/2000 | Eichelberger | ................ | 438/107 |
| 6,221,694 B1 * | 4/2001 | Bhatt et al. | ..................... | 438/122 |
| 6,239,482 B1 * | 5/2001 | Fillion et al. | .................. | 257/678 |
| 6,586,276 B2 * | 7/2003 | Towle et al. | ..................... | 438/113 |
| 6,730,536 B1 * | 5/2004 | Glenn et al. | ..................... | 438/57 |
| 6,734,534 B1 | 5/2004 | Vu et al. | | |
| 6,825,063 B2 * | 11/2004 | Vu et al. | ........................ | 438/106 |
| 6,972,964 B2 * | 12/2005 | Ho et al. | ........................ | 361/761 |
| 7,078,788 B2 * | 7/2006 | Vu et al. | ........................ | 257/668 |
| 7,141,884 B2 * | 11/2006 | Kojima et al. | ................ | 257/778 |
| 7,242,092 B2 * | 7/2007 | Hsu | .................................. | 257/723 |
| 7,413,926 B2 * | 8/2008 | Smith | .......................... | 438/107 |
| 7,619,901 B2 * | 11/2009 | Eichelberger et al. | ........ | 361/763 |
| 7,732,909 B2 * | 6/2010 | Tuominen | ..................... | 257/687 |
| 2005/0258548 A1 * | 11/2005 | Ogawa et al. | ................. | 257/778 |
| 2007/0096292 A1 * | 5/2007 | Machida | ........................ | 257/700 |
| 2007/0264754 A1 * | 11/2007 | Jobetto | .......................... | 438/114 |
| 2008/0079157 A1 * | 4/2008 | Kurita et al. | ................... | 257/753 |

(Continued)

FOREIGN PATENT DOCUMENTS

WO WO02/33751 A2 4/2002

*Primary Examiner* — Chris Chu
(74) *Attorney, Agent, or Firm* — IPUSA, PLLC

(57) ABSTRACT

A disclosed semiconductor device includes a reinforcing board having first and second faces, an electronic part accommodating portion penetrating the reinforcing board, a through hole, an electronic part having a front face on which an electrode pad is formed and a back face, a through electrode installed inside the through hole, a first sealing resin filling a gap between the through electrode and an inner wall of the through hole, a second sealing resin filled into the electronic part accommodating portion while causing the bonding face of the electrode pad of the electronic part accommodating portion to be exposed to an outside, and a multi-layered wiring structure configured to include insulating layers laminated on the first face of the reinforcing board and an interconnection pattern, wherein the interconnection pattern is directly connected to the electrode pad of the electronic part and the through electrode.

6 Claims, 19 Drawing Sheets

U.S. PATENT DOCUMENTS

| | | | |
|---|---|---|---|
| 2008/0083980 A1* | 4/2008 | Yang et al. | 257/700 |
| 2008/0157341 A1* | 7/2008 | Yang et al. | 257/700 |
| 2008/0315230 A1* | 12/2008 | Murayama | 257/98 |
| 2009/0014859 A1* | 1/2009 | Jeung et al. | 257/686 |
| 2010/0006331 A1* | 1/2010 | Hsu | 174/260 |
| 2010/0213616 A1* | 8/2010 | Uchiyama | 257/773 |
| 2010/0225001 A1* | 9/2010 | Hizume | 257/773 |
| 2010/0252937 A1* | 10/2010 | Uchiyama | 257/777 |

* cited by examiner

SEMICONDUCTOR DEVICE, MANUFACTURING METHOD THEREOF, AND ELECTRONIC DEVICE

CROSS-REFERENCE TO RELATED APPLICATIONS

This patent application is based upon and claims the benefit of priority of Japanese Patent Application No. 2009-096024 filed on Apr. 10, 2009, the entire contents of which are incorporated herein by reference.

BACKGROUND OF THE INVENTION

1. Field of the Invention

The present invention generally relates to a semiconductor device, a manufacturing method of the semiconductor device, and an electronic device. More specifically, the present invention relates to a semiconductor device including electronic parts, a reinforcing board having an electronic part accommodating portion for accommodating the electronic parts, and a multi-layered wiring structure electrically connected to the electronic parts, a manufacturing method of the semiconductor device, and an electronic device.

2. Description of the Related Art

An example of a semiconductor device is fabricated by directly connecting electrode pads of an electronic part to an interconnection pattern of a multi-layered wiring structure to reduce the size in the thickness direction of the semiconductor device. Another example of the semiconductor device is fabricated such that a reinforcing board on which an electronic part accommodating portion for accommodating electronic parts is installed is provided to reinforce the strength of the semiconductor device as illustrated in FIG. 1.

FIG. 1 is a cross-sectional view of the above example of the semiconductor device.

Referring to FIG. 1, the above example of the semiconductor device 200 includes a reinforcing board 201, an electronic part 202, a sealing resin 203, a multi-layered wiring structure 205 and external connection terminals 206.

The reinforcing board 201 has a multi-layered wiring structure forming face 201A on which the multi-layered wiring structure 205 is formed, and an electronic part accommodating portion 211 for accommodating the electronic part 202. The reinforcing board 201 is provided to secure the strength of the semiconductor device 200. The material of the reinforcing board 201 may be a metallic material.

The electronic part 202 has a thickness substantially the same as that of the reinforcing board 201. The electronic part 202 has an electrode pad forming face 202A and electrode pads 213 having bonding faces 213A. The electronic part 202 is accommodated in the electronic part accommodating portion 211 so that the electrode pad forming face 202A and the bonding face 213A are substantially even with the multi-layered wiring structure forming face 201A.

The sealing resin 203 is provided on the electronic part accommodating portion 211. With this, the sealing resin 203 seals a side of the electronic part 202. A lower face 203A of the sealing resin 203 is formed to be substantially even with the multi-layered wiring structure forming face 201A.

The multi-layered wiring structure 205 includes a laminated body 215, an interconnection pattern 216, and a solder resist layer 217. The laminated body 215 is formed by laminating the insulating layers 221 and 222. The insulating layer 221 is provided on the multi-layered wiring structure forming face 201A, the electrode pad forming face 202A, a bonding face 213A, and the lower face of the sealing resin 203. The insulating layer 222 is provided on a face of the insulating layer 221 opposite to a face in contact with the multi-layered wiring structure forming face 201A.

The interconnection pattern 216 is installed inside the laminated body 215. The interconnection pattern 216 includes a first bonding face 216A and a second bonding face 216B. The first bonding face 216A is exposed from the insulating layer 221, and is directly connected to the bonding face 213A of the electrode pad 213. The second bonding face 216B is exposed from the solder resist layer 217, and connected to an external connection terminal 206. With this, the interconnection pattern 216 electrically connects the electronic part 202 to the external connection terminal 206.

The solder resist layer 217 is formed on the face of the insulating layer 222 opposite to the face in contact with the insulating layer 221. The solder resist layer 217 includes opening portions 217A at which the second bonding faces 216B are exposed.

The external connection terminals 206 are connected to the bonding faces 216B. The external connection terminals 206 are terminals connected to a substrate, such as a mother board, on which the semiconductor device 200 is mounted.

PATENT DOCUMENT 1

International Publication Pamphlet No. WO 02/33751

With the above example of the semiconductor device 200, although it is possible to reinforce the strength of the semiconductor device 200, another semiconductor device may not be electrically connected to the semiconductor device 200 by laminating these. Said differently, high-density packaging may not be achieved.

SUMMARY OF THE INVENTION

Accordingly, an embodiment of the present invention may provide a novel and useful semiconductor device which is capable of improving a packaging density by electrically connecting a semiconductor device and another semiconductor device after laminating the other semiconductor device on the semiconductor device, a method of manufacturing the semiconductor device, and an electronic device including the semiconductor device, solving one or more of the problems discussed above.

More specifically, the embodiments of the present invention may provide a semiconductor device including a reinforcing board having a first face and a second face; an electronic part accommodating portion configured to penetrate the reinforcing board; a through hole configured to penetrate the reinforcing board; an electronic part configured to have a front face on which an electrode pad is formed and a back face, and be accommodated into the electronic part accommodating portion; a through electrode configured to be installed inside the through hole; a first sealing resin configured to fill a gap between the through electrode and an inner wall of the through hole; a second sealing resin configured to be filled into the electronic part accommodating portion while causing the bonding face of the electrode pad of the electronic part accommodating portion to be exposed to an outside; and a multi-layered wiring structure configured to include insulating layers laminated on the first face of the reinforcing board and an interconnection pattern, wherein the interconnection pattern is directly connected to the electrode pad of the electronic part and the through electrode.

Another aspect of the present invention may be to provide the semiconductor device according to the preceding aspects wherein the second sealing resin is configured to cover the electronic part inside the electronic part accommodating portion while causing the bonding face of the electrode pad to be exposed to the outside, and has a first face substantially arranged on a plane where the electrode pad of the electronic part and the through electrode are directly connected, the through electrode has a first bonding face arranged on the first face of the reinforcing board, and the bonding face of the electrode pad, the first face of the reinforcing board, the first bonding face of the through electrode, the first face of second sealing resin and a face of the first sealing resin positioned on the first bonding face of the through electrode are arranged substantially on the plane where the electrode pad and the through electrode are directly connected.

Another aspect of the present invention may be to provide the semiconductor device according to the preceding aspects wherein the second sealing resin has a second face from which the back face of the electronic part is exposed to the outside, the through electrode has a second bonding face positioned on the other side of the reinforcing board, and the back face of the electronic part, the second face of the reinforcing board, the second bonding face of the through electrode, the second face of the second sealing resin and a face of the first sealing resin positioned on the second bonding face of the through electrode are arranged substantially on plane.

Another aspect of the present invention may be to provide a method of manufacturing a semiconductor device including forming a reinforcing board by forming an electronic part accommodating portion and a through hole respectively penetrating through a reinforcing board which has a first face and a second face; forming a through electrode inside the through hole of the reinforcing board; and filling a gap between an inner wall of the through hole and the through electrode with a first sealing resin; bonding the face of the reinforcing board to a supporting member; accommodating an electronic part configured to have a front face on which an electrode pad is formed and a back face into the electronic part accommodating portion of the reinforcing board and bonding the electrode pad to the supporting member; forming a second sealing resin inside the electronic part accommodating portion while exposing the back face of the electronic part to an outside; removing the supporting member from the reinforcing board; and forming a multi-layered wiring structure by laminating insulating layers and an interconnection pattern on the first face of the reinforcing board and directly connecting the interconnection pattern to the electrode pad of the electronic part and the through electrode.

Another aspect of the present invention may be to provide the method of manufacturing a semiconductor device according to the preceding aspects, wherein a process of forming the reinforcing board further including forming the electronic part accommodating portion to have a size capable of accommodating the electronic part; forming the through hole at a peripheral position of the electronic part accommodating portion; forming a supporting member having a planar supporting portion and a protruding portion that is made of a conductive material, that protrudes from a planar face of the supporting portion, that has a thickness substantially the same as the thickness of the reinforcing board, and that has an outer diameter smaller than an inner diameter of the through hole; mounting the reinforcing board on the supporting member and simultaneously inserting the protruding portion into the through hole while maintaining a gap between an inner side face of the through hole and an outer side face of the protruding portion; filling the gap with an insulating resin while an upper end face of the protruding portion of the supporting member is exposed to an outside; filling the gap with an insulating resin while an upper end face of the protruding portion of the supporting member is exposed to an outside; and removing the supporting portion to cause an lower end face of the protruding portion to be exposed to the outside and to form the through electrode using the protruding portion as a base material of the through electrode.

Another aspect of the present invention may be to provide the method of manufacturing a semiconductor device according to the preceding aspects, wherein the reinforcing board is made of a first metallic material, the through electrode is made of a second metallic material different form the first metallic material, and the process of forming the reinforcing board includes removing the supporting portion by etching.

Another aspect of the present invention may be to provide an electronic device including an electronic device including a semiconductor device including a reinforcing board having a first face and second face; an electronic part accommodating portion configured to penetrate the reinforcing board, a through hole configured to penetrate the reinforcing board, an electronic part configured to have a front face on which an electrode pad is formed and a back face, and be accommodated into the electronic part accommodating portion; a through electrode configured to be installed inside the through hole, a first sealing resin configured to fill a gap between the through electrode and an inner wall of the through hole, a second sealing resin configured to be filled into the electronic part accommodating portion while causing the bonding face of the electrode pad of the electronic part accommodating portion to be exposed to an outside, and a multi-layered wiring structure configured to include insulating layers laminated on the first face of the reinforcing board and an interconnection pattern, wherein the interconnection pattern is directly connected to the electrode pad of the electronic part and the through electrode; and another semiconductor device electrically connected to the semiconductor device via an internal connecting terminal.

Additional objects and advantages of the embodiment are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 2 through FIG. 19 of the embodiment of the present invention.

Hereinafter, reference symbols typically designate as follows:

10: electronic device;
11, 12: semiconductor device;
13: internal connecting terminal;
15: reinforcing board (board);
17, 18, 92: electronic part;
17A, 18A: electrode pad forming face (front face)
17B, 18B: back face;
21, 22: through electrode;
21A, 22A: first bonding face (lower end surface);
21B, 22B: second bonding face;
24: first sealing resin (insulating resin);
24A, 24B, 25A, 25B, 33B, 61A, 62A, 63A, 92A, 112A, 115A, 116A: face (lower end surface);
25: second sealing resin (sealing resin);
27: multi-layered wiring structure;
28: external connection terminal;
33: main body of reinforcing board;
33A: multi-layered wiring structure forming face (first face);
33B: second face;
34: electronic part accommodating portion;
35, 36: through hole;
41, 42, 43, 44, 106: electrode pad;
41A, 42A, 43A, 44A, 47A, 48A, 49A: bonding face;
46: laminated body;
47, 48, 49: external connection pad;
51, 52, 53: interconnection pattern;
55, 102, 103: solder resist layer;
55A, 55B, 55C, 102A, 103A, 121, 122, 123, 124, 125, 126: opening portion;
61, 62, 63: insulating layer;
65, 66, 68, 71, 73, 74, 76, 78, 81, 82, 84, 86: via;
67, 69, 75, 77, 83, 85: interconnection;
91: interconnection substrate;
93: molding resin;
94: metallic wire;
96: substrate main body;
96A, 112A: upper face;
96B: lower face;
97, 98: pad;
111: supporting member for forming through electrode;
112: supporting portion;
113: protruding portion;
113A: upper end face upper end face;
115: supporting body (plate); and
115A: face (planar face)

Figure 1:
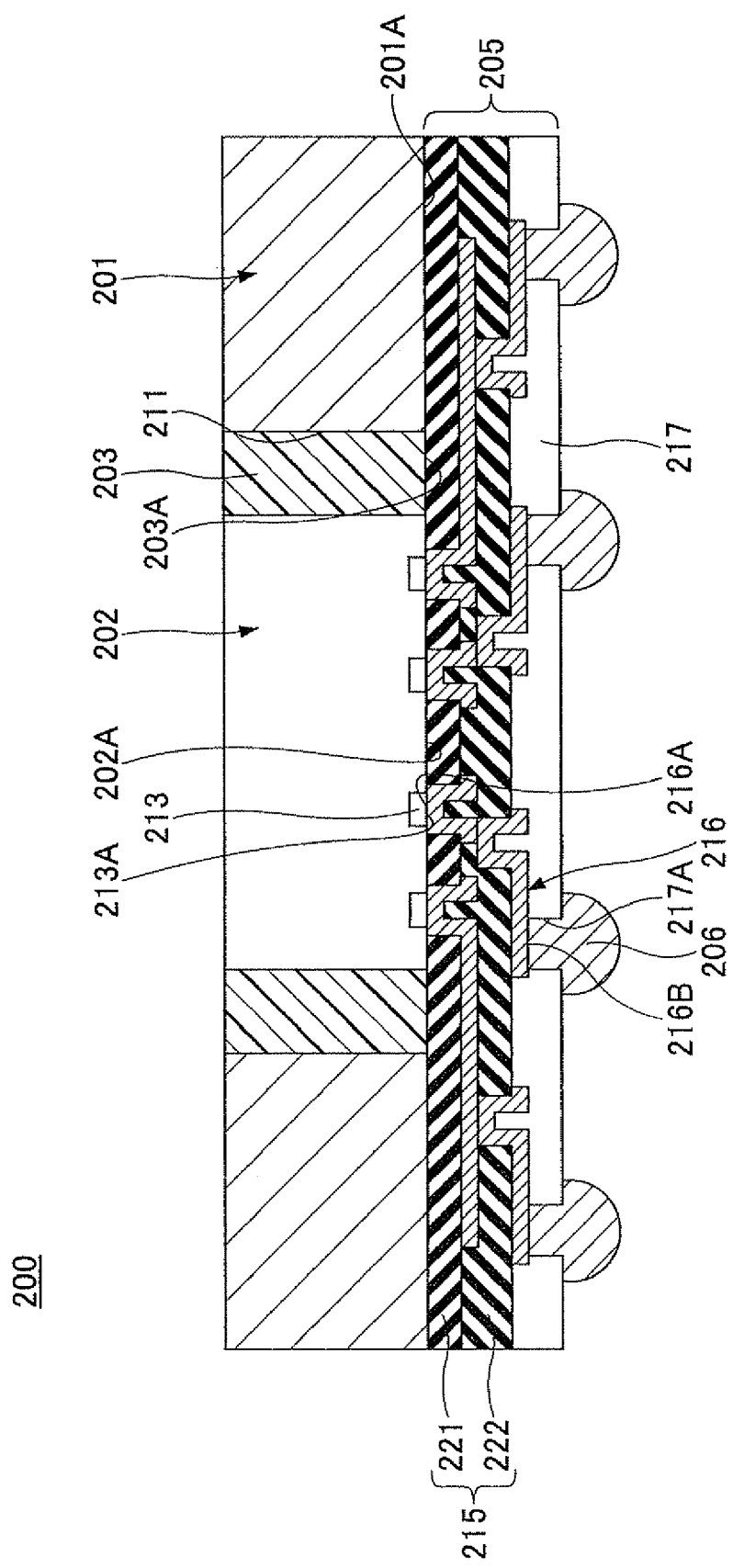
FIG. 1 is a cross-sectional view of the above example of the semiconductor device.
Figure 2:
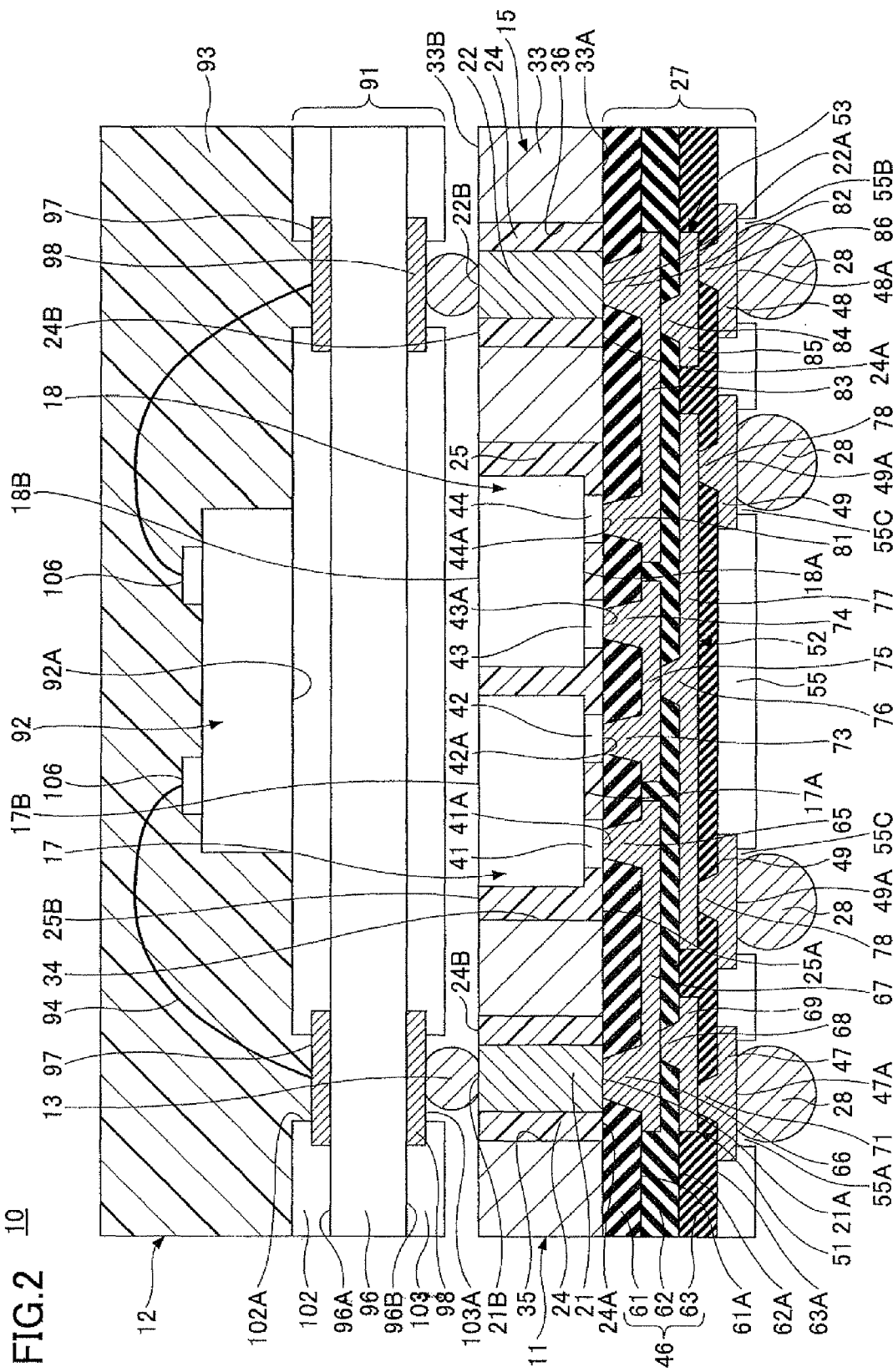
FIG. 2 is a cross-sectional view of an electronic device of an embodiment according to the present invention.

FIG. 2 is a cross-sectional view of an electronic device of an embodiment according to the present invention.

Referring to FIG. 2, the electronic device 10 includes a first semiconductor device 11, a second semiconductor device 12 electrically connected to the first semiconductor device 11 and positioned above the first semiconductor device 11, and an internal connecting terminal 13.

The first semiconductor device 11 includes a reinforcing board 15, electronic parts 17 and 18, through electrodes 21 and 22, a first sealing resin 24, a second sealing resin 25, a multi-layered wiring structure 27, and external connection terminals 28.

The reinforcing board 15 includes a main body 33 of the reinforcing board, an electronic part accommodating portion 34, and through holes 35 and 36. The main body 33 of the reinforcing board 15 is shaped like a plate.

The reinforcing board 33 includes a multi-layered wiring structure forming face 33A on which the multi-layered wiring structure 27 is formed, and a face 33B which is positioned on a side opposite to the side of the multi-layered wiring structure forming face 33A and faces the semiconductor device 12.

The main body 33 of the reinforcing board 15 body is made of a metallic material having high rigidity. Specifically, the first metallic material is, for example, Cu or 42 alloy. The main body 33 of the reinforcing board 15 has a thickness substantially the same as those of the electronic parts 17 and 18. The thickness of the main body 33 of the reinforcing board 15 is, for example, 200 μm.

The electronic part accommodating portion 34 is formed to penetrate through the main body 33 of the reinforcing board 15. The electronic part accommodating portion 34 has a size able to accommodate the electronic parts 17 and 18. When the size of the electronic parts 17 and 18 parallel to the face 33B is 5 mm×9 mm, the size of the electronic part accommodating portion 34 parallel to the face 33B may be 11 mm×30 mm.

The through holes 35 and 36 are formed to penetrate through the main body 33 of the reinforcing board 15 at portions positioned around the electronic part accommodating portion 34. The diameters of the through holes 35 and 36 are formed to be larger than those of the through electrodes 21 and 22. The diameters of the through holes 35 and 36 are, for example, 200 μm.

The above-mentioned reinforcing board 15 is a member for reinforcing the strength of the first semiconductor device 11.

The electronic part 17 includes electrode pads 41 and 42 having bonding faces 41A and 42A, an electrode pad forming face 17A, and a back face 17B arranged on a side opposite to the electrode pad forming face 17A.

The electronic part 17 is accommodated in the electronic part accommodating portion 34 so that the bonding faces 41A and 42A become substantially even to the multi-layered wiring structure forming face 33A. The thickness of the electronic part 17 is substantially the same as the thickness of the main body 33 of the reinforcing board 15. In this way, the back face 17B of the electronic part 17 is arranged to be substantially the same as the face 33B of the main body 33 of the reinforcing board 15. The thickness of the electronic part 17 is, for example, 200 μm.

The electronic part 18 includes electrode pads 43 and 44 having bonding faces 43A and 44A, an electrode pad forming face 18A on which the electrode pads 43 and 44 are formed, and a back face 18B arranged on a side opposite to the electrode pad forming face 18A.

The electronic part 18 is accommodated in the electronic part accommodating portion 34 so that the bonding faces 43A and 44A become substantially even to the multi-layered wiring structure forming face 33A. The thickness of the electronic part 18 is substantially the same as the thickness of the main body 33 of the reinforcing board 15. In this way, the back face 18B of the electronic part 18 is arranged to be substantially even to the face 33B of the main body 33 of the reinforcing board 15. The thickness of the electronic part 18 is, for example, 200 μm.

The electronic parts 17 and 18 are, for example, semiconductor chips. Specifically, there are cases where the electronic parts 17 and 18 are semiconductor chips for a central processing unit (CPU), one of the electronic parts 17 and 18 may be a semiconductor chip for a CPU and the other may be a semiconductor chip for a memory, and one of the electronic parts 17 and 18 may be a semiconductor chip for a CPU and the other may be a semiconductor chip for a graphics processing unit (GPU).

The through electrode 21 is provided in a through hole 35 while interposing a gap between the through electrode 21 and the through hole 35. The through electrode 21 is shaped like a circle. The through electrode 21 has a first bonding face 21A, i.e. a lower end face of the through electrode 21, and a second bonding face 21B, i.e. an upper end face of the through electrode 21. The first bonding face 21A is arranged to be on a substantially same level of the multi-layered wiring structure forming face 33A. The first bonding face 21A is electrically connected to the electronic part 17 and an external connection pad 47 via an interconnection pattern 51 (described later) included in the multi-layered wiring structure 27.

The height of the through electrode 21 is substantially the same as the thickness of the main body 33 of the reinforcing board 15. In this way, by making the height of the through electrode 21 substantially the same as the thickness of the main body 33 of the reinforcing board 15, the second bonding face 21B may be arranged to be substantially the same level as the face 33B of the main body 33 of the reinforcing board 15. The second bonding face 21B is electrically connected to the second semiconductor device 12 via the internal connecting terminal 13. The height of the through electrode 21 is, for example, 200 μm. When the diameter of the through hole 35 is 200 μm, the diameter of the through electrode 21 is, for example, 100 μm. The through electrode 21 is made of a second metallic material different from the first metallic material, of which the main body 33 of the reinforcing board 15 is made. The second metallic material is, for example, a Cu plate.

The through electrode 22 is provided in the through hole 36 while interposing a gap between the through electrode 22 and the through hole 36. The through electrode 22 is shaped like a circle. The through electrode 22 has a first bonding face 22A, i.e. a lower end face of the through electrode 22, and a second bonding face 22B, i.e. an upper end face of the through electrode 22. The first bonding face 22A is arranged to be on a substantially same level of the multi-layered wiring structure forming face 33A. The first bonding face 22A is electrically connected to the electronic part 18 and an external connection pad 48 via an interconnection pattern 53 (described later) included in the multi-layered wiring structure 27.

The height of the through electrode 22 is substantially the same as the thickness of the main body 33 of the reinforcing board 15. In this way, when the height of the through electrode 22 is substantially the same as the thickness of the main body 33 of the reinforcing board 15, the second bonding face 22B may be arranged to be substantially the same level as the face 33B of the main body 33 of the reinforcing board 15. The second bonding face 22B is electrically connected to the second semiconductor device 12 via the internal connecting terminal 13. The height of the through electrode 22 is, for example, 200 μm. When the diameter of the through hole 36 is 200 μm, the diameter of the through electrode 22 is, for example, 100 μm. The through electrode 22 is made of a second metallic material different from the first metallic material, of which the main body 33 of the reinforcing board 15 is made. The second metallic material is, for example, a Cu plate.

In this way, the through holes 35 and 36 are formed to penetrate the main body 33 of the reinforcing board 15 at the portions positioned around the electronic part accommodating portion 34. The through electrodes 21 and 22 are provided in the through holes 35 and 36 in order to be electrically connected to the electronic parts 17 and 18 and the multi-layered wiring structure 27. Thus, the second semiconductor device 12 is laminated on the first semiconductor device 11 having the reinforcing board 15. As a result, it is possible to improve the packaging density by electrically connecting the first semiconductor device 11 and the second semiconductor device 12 via internal connecting terminals 13, which are connected to the second bonding faces 21B and 22B of the through electrodes 21 and 22.

A protecting layer (not illustrated) may be provided on the second bonding faces 21B and 22B of the through electrodes 21 and 22. The protecting layer is, for example, a Ni/Au laminated film which is formed by sequentially laminating a Ni plated layer and an Au plated layer and provided on the second bonding faces 21B and 22B.

The first sealing resin 24 is made of an insulating resin. The first sealing resin 24 fills the gaps between the through electrodes 21 and 22 and the through holes 35 and 36 while maintaining exposure of the first and second bonding faces 21A, 22A, 21B and 22B of the through electrodes 21 and 22.

The first sealing resin 24 has the thickness substantially the same as that of the main body 33 of the reinforcing board 15. The first sealing resin 24 has the first flat face 24A and a second flat face 24B arranged on a side opposite to the first flat face 24A. The face 24A of the first sealing resin 24 is arranged to be substantially on the same level of the first bonding faces 21A and 22A and the multi-layered wiring structure forming face 33A. The second flat face 24B of the first sealing resin 24 is arranged to be substantially on the same level as the second bonding faces 21B and 22B of the through electrodes 21 and 22 and the face 33S of the main body 33 of the reinforcing board 15. The thickness of the first sealing resin 24 is, for example, 200 μm. The material of the first sealing resin 24 is, for example, an epoxy resin.

As described, it is possible to insulate the gaps between the through electrodes 21 and 22 and the main body 33 of the reinforcing board 15 by providing the first sealing resin 24 which has an insulating property and which is provided between the through electrodes 21 and 22 and portions of the main body 33 of the reinforcing board 15 corresponding to the through holes 35 and 36.

The electronic part accommodating portion 34 accommodating the electronic parts 17 and 18 is filled with the second sealing resin 25 to cover the the electronic part inside the electronic part accommodating portion 34. The side faces of the electronic parts 17 and 18 and the electrode pad forming faces 17A and 18A are sealed by the second sealing resin 25 while exposing the bonding faces 41A, 42A, 43A and 44A and back faces 17B and 18B to the outside. The second sealing resin 25 has a thickness substantially the same as that of the main body 33 of the reinforcing board 15. The second sealing resin 25 has a first flat face 25A and a second flat face 25B arranged opposite to the first flat face 25A. The face 25A of the second sealing resin 25 is arranged to be substantially even with the bonding faces 41A, 42A, 43A and 44A and the multi-layered wiring structure forming face 33A. The second flat face 25B of the second resin 25 is arranged to be substantially even with the back faces 17B and 18B of the electronic parts 17 and 18 and the face 33B of the main body of the reinforcing board 15. The thickness of the second sealing resin 25 is, for example, 200 μm. The material of the second sealing resin 25 is, for example, an epoxy resin.

As described, the back faces 17B and 18B, the second bonding faces 21B and 22B of the through electrodes 21 and 22, the face 24S of the first sealing resin 24 and the second flat face 25B of the second sealing resin 25S are arranged on the same plane.

In this way, the face of the first semiconductor device 11 on a side facing the second semiconductor device 12 becomes flat by arranging the back faces 17S and 18B of the electronic parts 17 and 18, the second bonding faces 21B and 22B of the through electrodes 21 and 22, the second flat face 24B of the first sealing resin 24, and the second flat face 25B of the second sealing resin 25 on the same plane. Therefore, it is possible to reduce the spherical diameter of the internal connecting terminal 13, electrically connecting the first semiconductor device 11 to the second semiconductor device 12. Then, the thickness of the electronic device 10 may be reduced.

The multi-layered wiring structure 27 includes a laminated body 46, external connection pads 47 to 49, interconnection patterns 51 to 53, and a solder resist layer 55.

The laminated body 46 is formed by laminating the insulating layers 61 to 63. The insulating layer 61 is provided to cover the multi-layered wiring structure forming face 33A, the bonding faces 41A, 42A, 43A and 44A of the electrode pads 41 to 44, the first flat face 24A of the first sealing resin 24, the first bonding faces 21A and 22A of the through electrodes 21 and 22, and the first flat face 25A of the second sealing resin 25.

The insulating layer 62 is provided on a face 61A of the insulating layer 61, the face 61A is a face of the insulating layer 61 on a face opposite to a face in contact with the multi-layered wiring structure forming face 33A. The insulating layer 63 is provided on the insulating layer 62 a face opposite to a face in contact with a face 61A of the insulating layer 61.

For example, the insulating layers 61 to 63 are made of insulating resin layers (e.g. an epoxy resin layer). The thicknesses of the insulating layers 61 to 63 are, for example, 5 thru 30 μm.

The external connection pads 47, 48 and 49 are provided on a face 63A of the insulating layer 63. The external connection pads 47, 48 and 49 have bonding faces 47A, 48A and 49A, to which the external connection terminals 28 are attached. Materials of the external connection pads 47, 48 and 49 are, for example, Cu.

The interconnection pattern 51 includes via 65, 66, 68 and 71 and interconnections 67 and 69. The via 65 penetrates the insulating layer 61 at a portion facing the electrode pad 41. One end of the via 65 is directly connected to the bonding face 41A of the electrode pad 41 of the electronic part 17. The other end of the via 65 is formed integrally with the interconnection 67. Thus, the via 65 electrically connects the electrode pad 41 to the interconnection 67.

The via 66 penetrates the insulating layer 61 at a portion facing the first bonding face 21A of the through electrode 21. One end of the via 66 is connected to the first bonding face 21A of the through electrode 21. The other end of the via 66 is formed integrally with the interconnection 67. Thus, the via 66 electrically connects the through electrode 21 to the interconnection 67.

The interconnection 67 is provided on the face 61A of the insulating layer 61. The interconnection 67 is integrally formed with the other ends of the via 65 and via 66. Thus, the interconnection 67 electrically connects the electronic part 17 to the through electrode 21.

The via 68 penetrates the insulating layer 62 at a portion between the interconnection 67 and the interconnection 69. One end of the via 68 is in contact with the interconnection 67, and the other end of the via 68 is integrally formed with the interconnection 69. Thus, the via 68 electrically connects the interconnection 67 and the interconnection 69.

The interconnection 69 is provided on the face 62A of the insulating layer 62. The interconnection 69 is integrally formed with the other end of the via 68. The interconnection 69 is electrically connected to the interconnection 67 by way of the via 68.

The via 71 penetrates the insulating layer 63 at a portion between the interconnection 69 and the external connection pad 47. One end of the via 71 is connected to the interconnection 69, and the other end of the via 71 is integrally formed with the external connection pad 47.

The above interconnection pattern 51 is directly connected to the electrode pad 41 provided in the electronic part 17, and connected to the through electrode 21 and the external connection pad 47. The material of the interconnection pattern 51 is, for example, Cu.

An interconnection pattern 52 includes vias 73, 74, 76 and 78 and interconnections 75 and 77. The via 73 penetrates the insulating layer 61 at a portion facing the electrode pad 42. One end of the via 73 is directly connected to the bonding face 42A of the electrode pad 42 of the electronic part 17. The other end of the via 73 is formed integrally with the interconnection 75. Thus, the via 73 electrically connects the electrode pad 42 and the interconnection 75.

The via 74 penetrates the insulating layer 61 at a portion facing the electrode pad 43. One end of the via 74 is directly connected to the bonding face 43A of the electrode pad 43 of the electronic part 18. The other end of the via 74 is formed integrally with the interconnection 75. Thus, the via 74 electrically connects the electrode pad 43 and the interconnection 75.

The interconnection 75 is provided on the face 61A of the insulating layer 61. The interconnection 75 is integrally formed with the other ends of the vias 73 and 74. Thus, the interconnection 75 electrically connects the electronic part 17 and the electronic part 18.

The via 76 penetrates the insulating layer 62 at a portion between the interconnection 75 and the interconnection 77. One end of the via 76 is in contact with the interconnection 75, and the other end of the via 76 is integrally formed with the interconnection 77. Thus, the via 76 electrically connects the interconnection 75 and the interconnection 77.

The interconnection 77 is provided on the face 62A of the insulating layer 62. The interconnection 77 is integrally formed with the other end of the via 76. The interconnection 77 is electrically connected to the interconnection 75 by way of the via 76.

The via 78 penetrates the insulating layer 63 at a portion between the interconnection 77 and the external connection pad 49. One end of the via 78 is connected to the interconnection 77, and the other end of the via 78 is integrally formed with the external connection pad 49.

The above-described interconnection pattern 52 is directly connected to the electrode pads 42 and 43 provided in the electronic parts 17 and 18, and connected to the external connection pad 49. The material of the interconnection pattern 52 is, for example, Cu.

The interconnection pattern 53 includes vias 81, 82, 84 and 86, and interconnections 83 and 85. The via 81 penetrates the insulating layer 61 at a portion facing the electrode pad 44. One end of the via 81 is directly connected to the bonding face 44A of the electrode pad 44 of the electronic part 18. The other end of the via 81 is formed integrally with the interconnection 83. Thus, the via 81 electrically connects the electrode pad 44 and the interconnection 83.

The via 82 penetrates the insulating layer 61 at a portion facing the first bonding face 22A of the through electrode 22. One end of the via 82 is connected to the first bonding face 22A of the through electrode 22. The other end of the via 82 is formed integrally with the interconnection 83. Thus, the via 82 electrically connects the through electrode 22 and the interconnection 83.

The interconnection 83 is provided on the face 61A of the insulating layer 61. The interconnection 83 is integrally formed with the other ends of the vies 81 and 82. Thus, the interconnection 83 electrically connects the electronic part 18 and the through electrode 22.

The via 84 penetrates the insulating layer 62 at a portion between the interconnection 83 and the interconnection 85. One end of the via 84 is in contact with the interconnection 83, and the other end of the via 84 is integrally formed with the interconnection 85. Thus, the via 84 electrically connects the interconnection 83 and the interconnection 85.

The interconnection 85 is provided on the face 62A of the insulating layer 62. The interconnection 85 is integrally formed with the other end of the via 84. The interconnection 85 is electrically connected to the interconnection 83 via the via 84.

The via 86 penetrates the insulating layer 63 at a portion between the interconnection 85 and the external connection pad 48. One end of the via 86 is connected to the interconnection 85, and the other end of the via 86 is integrally formed with the external connection pad 48.

The above interconnection pattern 53 is directly connected to the electrode pad 44 provided in the electronic part 18, and connected to the through electrode 22 and the external connection pad 48. The material of the interconnection pattern 53 is, for example, Cu.

In this way, the multi-layered wiring structure 27 having the interconnection patterns 51 to 53 is provided in the multi-layered wiring structure forming face 33A, the bonding faces 41A, 42A, 43A and 44A of the electrode pad 41 to 44, the first bonding faces 21A and 22A, the first flat face 24A of the first sealing resin 24, and the first flat face 25A of the second sealing resin 25, which are arranged on the same plane. Therefore, it is possible to reduce the thickness of the first semiconductor device 11 in comparison with a case where the electronic parts 17 and 18 are directly connected to the multi-layered wiring structure 27 via bumps and metallic wires.

The above multi-layered wiring structure 27 is configured to have a thickness thinner than the thicknesses of the electronic parts 17 and 18. When the thicknesses of the electronic parts 17 and 18 are, for example, 200 μm, the thickness of the multi-layered wiring structure 27 is, for example, 20 thru 80 μm.

The solder resist layer 55 is provided on the face 63A of the insulating layer 63. The solder resist layer 55 includes opening portions 55A, 555 and 55C. The opening portion 55A is formed to expose the bonding face 47A of the external connection pad 47 to the outside. The opening portion 55B is formed to expose the bonding face 48A of the external connection pad 48 to the outside. The opening portion 550 is formed to expose the bonding face 49A of the external connection pad 49 to the outside.

Each of the external connection terminals 28 is provided in the respective bonding faces 47A, 48A and 49A. The external connection terminals 28 are electrically connected to a board (not illustrated) when the electronic device 10 is installed in the board such as a mother board (not illustrated).

With the semiconductor device of the embodiment, the through holes 35 and 36 penetrating the main body 33 of the reinforcing board 15 at the portion in a periphery of the electronic part accommodating portion 34 accommodating the electronic parts 17 and 18 are formed. Further, the semiconductor device 12 is laminated on the first semiconductor device 11 having the reinforcing board 15 while connecting the semiconductor device 11 and the semiconductor device 12 by providing the through electrodes 21 and 22 electrically connected to electronic parts 17 and 18 and the multi-layered wiring structure 27 in the through holes 35 and 36. Furthermore, the first semiconductor device 11 is connectable to the second semiconductor device 12 via the internal connecting terminals 13, connected to the second bonding faces 21B and 22B of the through electrodes 21 and 22. Therefore, it is possible to improve the packaging density.

The semiconductor device 12 includes an interconnection substrate 91, an electronic part 92 and a molding resin 93. The interconnection substrate 91 includes a substrate main body 96, pads 97 and 98 and solder resist layers 102 and 103.

The substrate main body 96 is shaped like a plate. The substrate main body 96 has, for example, a multi-layered wiring structure including a laminated body (not illustrated) formed by laminating plural insulating resin layers (e.g. epoxy resin layer) and an interconnection pattern (not illustrated) which is provided in the laminated body and electrically connects the pads 97 and 98.

The pad 97 is provided on an upper face 96A of the substrate main body 96. The pad 97 is connected to one end of a metallic wire 94 (e.g., Au wire). The pad 97 is electrically connected to the electronic part 92 via the metallic wire 94. The material of the pad 97 is, for example, Cu.

The pad 98 is provided on a lower face 96B of the substrate main body 96. The pad 98 is connected to the internal connecting terminal 13. The pad 98 is electrically connected to the pad 97, and further electrically connected to the first semiconductor device 11 via the internal connecting terminal 13. The material of the pad 98 is, for example, Cu.

The solder resist layer 102 is provided on the upper face 96A of the substrate main body 96. The solder resist layer 102 includes the opening portion 102A from which the upper face of the pad 97 is exposed.

The solder resist layer 103 is provided on the lower face 96B of the substrate main body 96. The solder resist layer 103 includes the opening portion 103A from which the lower face of the pad 98 is exposed.

The electronic part 92 includes plural electrode pads 106. The electronic part 92 is bonded onto the solder resist layer 102 so that a face of the electronic part 92 on a side without the electrode pads 106 is in contact with the upper face of the solder resist layer 102. The electrode pad 106 is connected to the other end of the metallic wire 94. Thus, the electronic part 92 is electrically connected to the interconnection substrate 91 via the metallic wire 94. The electronic part 92 is, for example, a semiconductor chip for a memory.

The molding resin 93 is provided on the upper face of the pad 97 and the upper face of the solder resist layer 102 to cover the electronic part 92 and the metallic wires 94. The molding resin 93 is a resin for sealing the electronic part 92 and the metallic wires 94. The material of the molding resin 93 is, for example, an epoxy resin.

The internal connecting terminals 13 are provided between the second bonding faces 21B and 22B of the through electrodes 21 and 22 provided in the first semiconductor device 11 and the pads 98 provided in the second semiconductor device 12. Referring to FIG. 2, the left one of the internal connecting terminals 13 is connected to the second bonding face 218 and the left pad 98. The right one of the internal connecting terminals 13 is connected to the second bonding face 228 and the right pad 98. The numbers of the internal connecting terminals 13 and the pads 98 are not limited to those illustrated in FIG. 2. Thus, the second semiconductor device 12 is electrically connected to the first semiconductor device 11. The internal connecting terminals 13 are, for example, solder balls.

With the electronic device of the embodiment, the through holes 35 and 36 are formed in the main body 33 of the reinforcing board 15, which is provided in the first semiconductor device 11 connected to a board (not illustrated). Further, the through electrodes 21 and 22, which are electrically connected to the multi-layered wiring structure 27 and the electronic parts 17 and 18 are embedded in the through holes 35 and 36, have the second bonding faces 21B and 22B connectable to the internal connecting terminals 13. The semiconductor device 12 is laminated on the first semiconductor device 11 having the reinforcing board 15 while electrically connecting the first semiconductor device 11 to the second semiconductor device 12 via the internal connecting terminals 13 connected to the second bonding faces 213 and 22B of the through electrodes 21 and 22. Therefore, the packaging density can be improved.

In this way, the face of the first semiconductor device 11 on a side facing the second semiconductor device 12 becomes flat by arranging the back faces 17B and 18B of the electronic parts 17 and 18, the second bonding faces 21B and 22B of the through electrodes 21 and 22, the second flat face 24B of the first sealing resin 24, and the second flat face 25B of the second sealing resin 25 on the same plane. It is possible to reduce the spherical diameter of the internal connecting terminal 13, electrically connecting the first semiconductor device 11 to the second semiconductor device 12. Therefore, the thickness of the electronic device 10 may be reduced.

When the spherical diameter of the internal connecting terminal 13 is reduced, it becomes possible to arrange the through electrodes 21 and 22 at small pitches. Therefore, it becomes possible to increase the number of terminals of the first semiconductor device 11 and 12.

Further, by arranging the through electrodes 21 and 22 at small intervals, it becomes possible to reduce the sizes of the first semiconductor device 11 and 12 and the electronic device 10 along directions of the faces of the electronic device 10 to downsize the electronic device 10.

FIG. 3 thru FIG. 18 illustrate a manufacturing process of the semiconductor device of the embodiment according to the present invention. In FIG. 3 thru FIG. 18, the same reference characters are applied to the same structural elements of the first semiconductor device 11 of the embodiment.

Referring to FIG. 3 thru FIG. 18, a method of manufacturing the first semiconductor device 11 of the embodiment is described.

Figure 3:
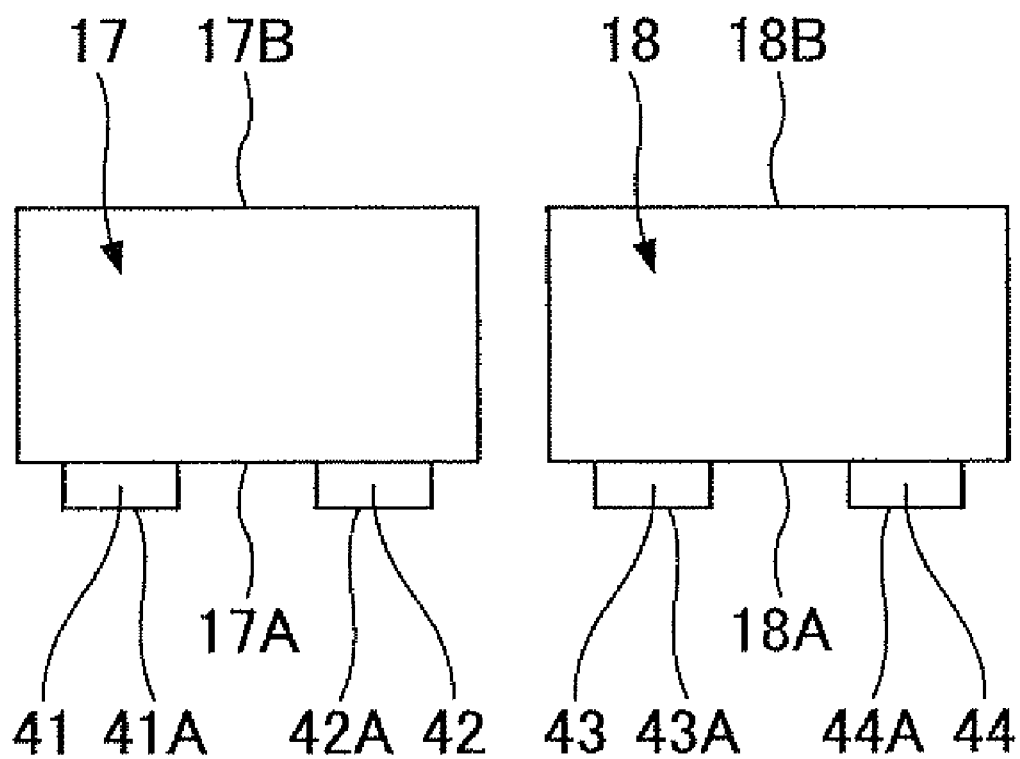
FIG. 3 illustrates a first manufacturing process of the semiconductor device of the embodiment according to the present invention.

First, in an electronic part preparing step illustrated in FIG. 3, there are prepared the electrode pads 41 and 42 having the bonding faces 41A and 42A, the electrode pad forming face 17A on which the electrode pads 41 and 42 are formed, the electronic part 17 having a back face 17B positioned on a side opposite to the electrode pad forming face 17A. The electrode pads 43 and 44 have the bonding faces 43A and 44A. The electrode pad forming face 18A has the electrode pads 43 and 44. The electronic part 18 has a back face positioned on a side opposite to the electrode pad forming face 18A.

The electronic parts 17 and 18 are, for example, semiconductor chips. Specifically, there are cases where the electronic parts 17 and 18 are semiconductor chips for a central processing unit (CPU), where one of the electronic parts 17 and 18 is a semiconductor chip for a CPU and the other is a semiconductor chip for a memory, and where one of the electronic parts 17 and 18 is a semiconductor chip for a CPU and the other is a semiconductor chip for a graphics processing unit (GPU). The thickness of the electronic parts 17 and 18 is, for example, 200 µm. The sizes of the electronic parts 17 and 18 in directions of the faces of the electronic parts 17 and 18 are, for example, 5 mm×9 mm.

Figure 4:
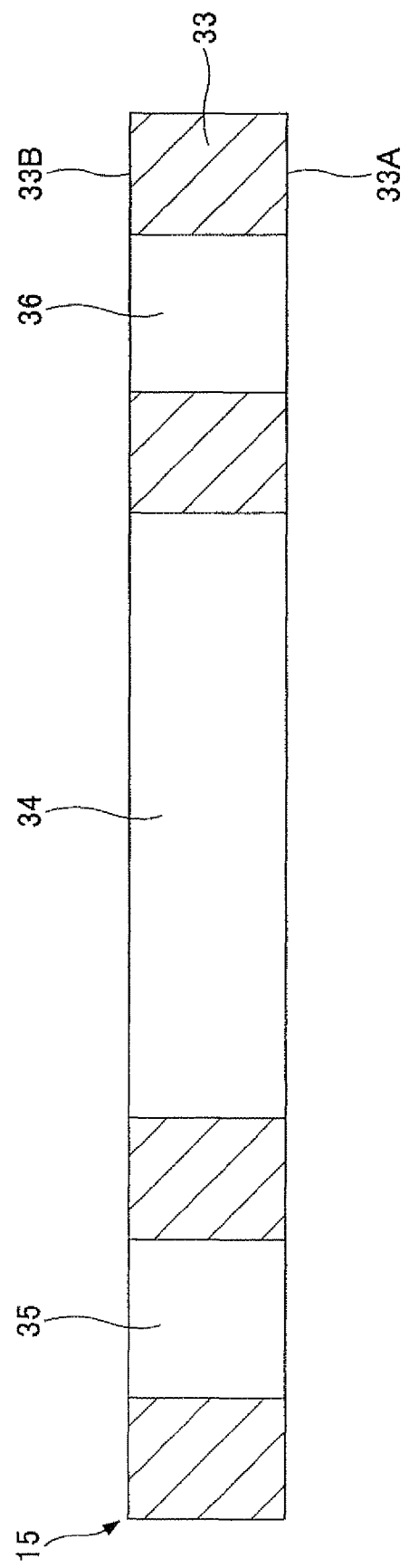
FIG. 4 illustrates a second manufacturing process of the semiconductor device of the embodiment according to the present invention.

FIG. 4 is a cross-sectional view of an example of the reinforcing board 15. In the step illustrated in FIG. 4, there is prepared the main body 33 of the reinforcing board 15 in a plate-like shape having the thickness substantially the same as those of the electronic parts 17 and 18, and including the multi-layered wiring structure forming face 33A. Next, in a reinforcing board forming step, electronic part accommodating portion 34 having a size able to accommodate the electronic parts 17 and 18 is formed in the reinforcing board 15 to penetrate the main body 33, and the through holes 35 and 36 are formed to penetrate the main body 33 of the reinforcing board 15 at a portion positioned in the periphery of the electronic part accommodating portion 34. Thus, the main body 33 of the reinforcing board 15, the electronic part accommodating portion 34, and the reinforcing board 15 having the through holes 35 and 36 are formed.

The electronic part accommodating portion 34 and the through holes 35 and 36 are made by, for example, an etching method.

The main body 33 of the reinforcing board body 15 is made of a first metallic material having high rigidity. Specifically, the first metallic material is, for example, Cu or 42 alloy.

When the thicknesses of the electronic parts 17 and 18 are 200 µm, the thickness of the main body 33 of the reinforcing board 15 is, for example, 200 µm.

When the size of the electronic parts 17 and 18 parallel to the faces 17A or 17B is 5 mm×9 mm, the size of the electronic part accommodating portion 34 parallel to the faces may be 11 mm×30 mm.

The cross-sectional shape of the through holes 35 and 36 is, for example, a circle. In this case, the diameters of the through holes 35 and 36 are formed to be larger than the diameters of the through electrodes 21 and 22. The diameters of the through holes 35 and 36 are, for example, 200 µm.

Figure 5:
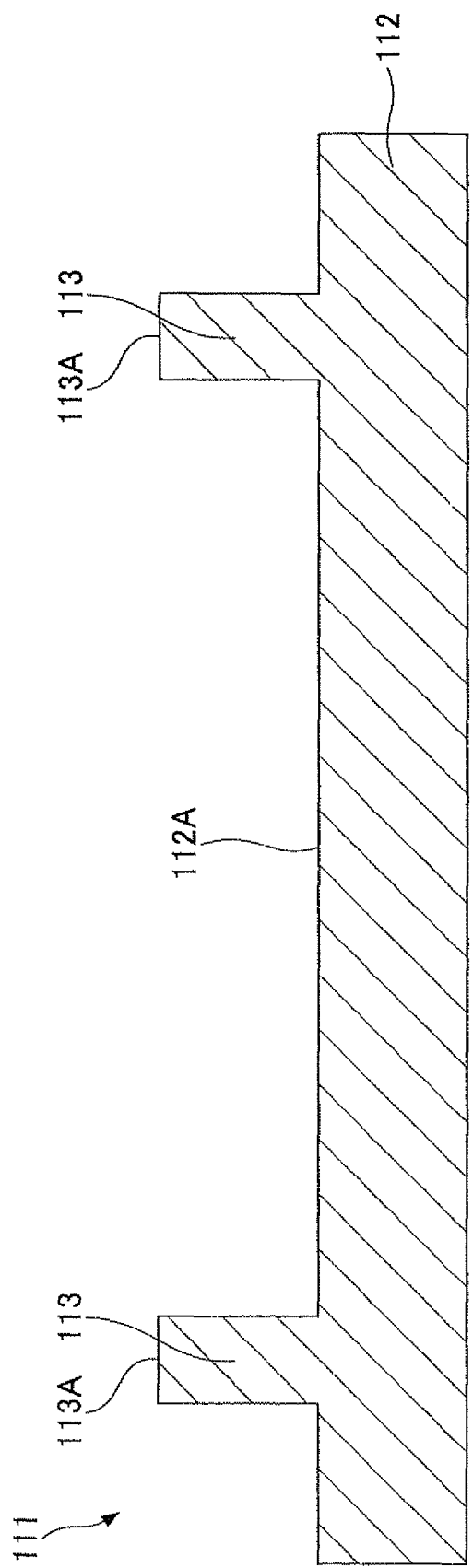
FIG. 5 illustrates a third manufacturing process of the semiconductor device of the embodiment according to the present invention.

FIG. 5 illustrates a step of forming a supporting member 111 for forming the through electrodes in a cross-sectional view of the supporting member 111. The supporting member 111 has a supporting portion 112 which may be shaped like a plate and has planar surfaces and a protruding portion 113, which protrudes from a face 112A of the supporting portion 112 at a portion corresponding to the through holes 35 and 36 formed in the reinforcing board 15. The protruding portions 113 may have a cylindrical shape. The protruding portions 113 have flat upper end faces 113A (the portions corresponding to the second bonding faces 21B and 22B of the through electrodes 21 and 22 described above), respectively. The protruding portions 113 have a height substantially the same as the thickness of the main body 33 and a diameter smaller than the through holes 35 and 36.

The material of the supporting member 111 for forming the through electrodes may be a second metallic material different from the first metallic material forming the main body 33. For example, when the first material is a 42 alloy, the second metallic material is, for example Cu.

By differentiating the metallic material forming the main body 33 from the metallic material of the supporting member 111 for forming the through electrode, it is possible to prevent the main body 33 from being etched when the supporting portion 112 forming the supporting member 111 is removed by etching in a step later illustrated in FIG. 8.

The first and second metallic materials may be the same, for example, Cu.

The supporting member 111 for forming the through electrode may be formed by etching or press-working a Cu plate, for example.

The supporting portion 112 is a member for supporting the reinforcing board 15. The thickness of the supporting portion 112 is, for example, 200 µm.

The protruding electrode 113 is a base material of the through electrodes 21 and 22, and has a shape similar to the through electrode 21 and 22. The shape of the protruding portion 113 is, for example, a cylindrical column. The diameter of the protruding portion 113 is substantially the same as the diameters of the through electrodes 21 and 22. When the diameters of the through electrodes 21 and 22 are 100 µm, the diameter of the protruding portion 113 is, for example, 100 µm. The height of the protruding portion 113 is, for example, 200 µm.

Figure 6:
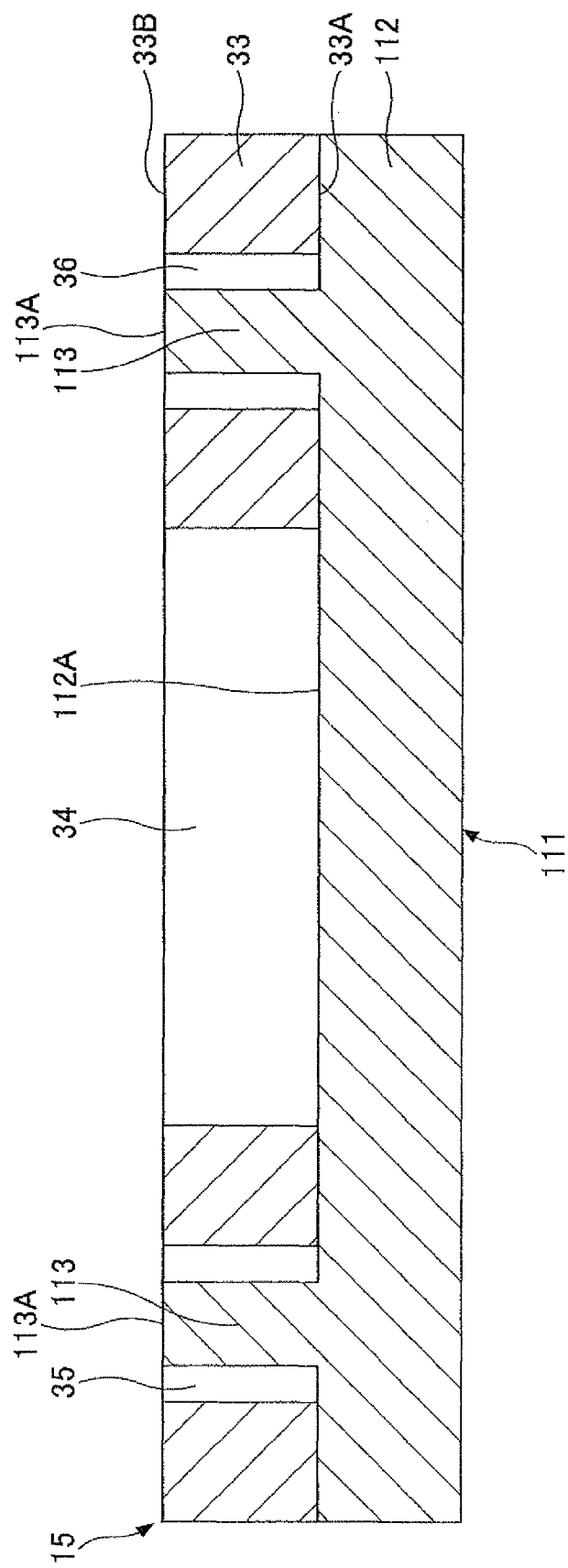
FIG. 6 illustrates a fourth manufacturing process of the semiconductor device of the embodiment according to the present invention.

In a reinforcing board mounting process illustrated in FIG. 6, the protruding portion 113 is inserted into the through holes 35 and 36, and the reinforcing board 15 is mounted on the supporting member 111 for forming the through electrodes 21 and (specifically, the upper face 112A of the supporting portion 112) to form gaps between the through holes 35 and 36 and the protruding portions.

Then, the upper end face 113A and the face 333 of the main body of the reinforcing board 15 are arranged on a substantially same plane.

Figure 7:
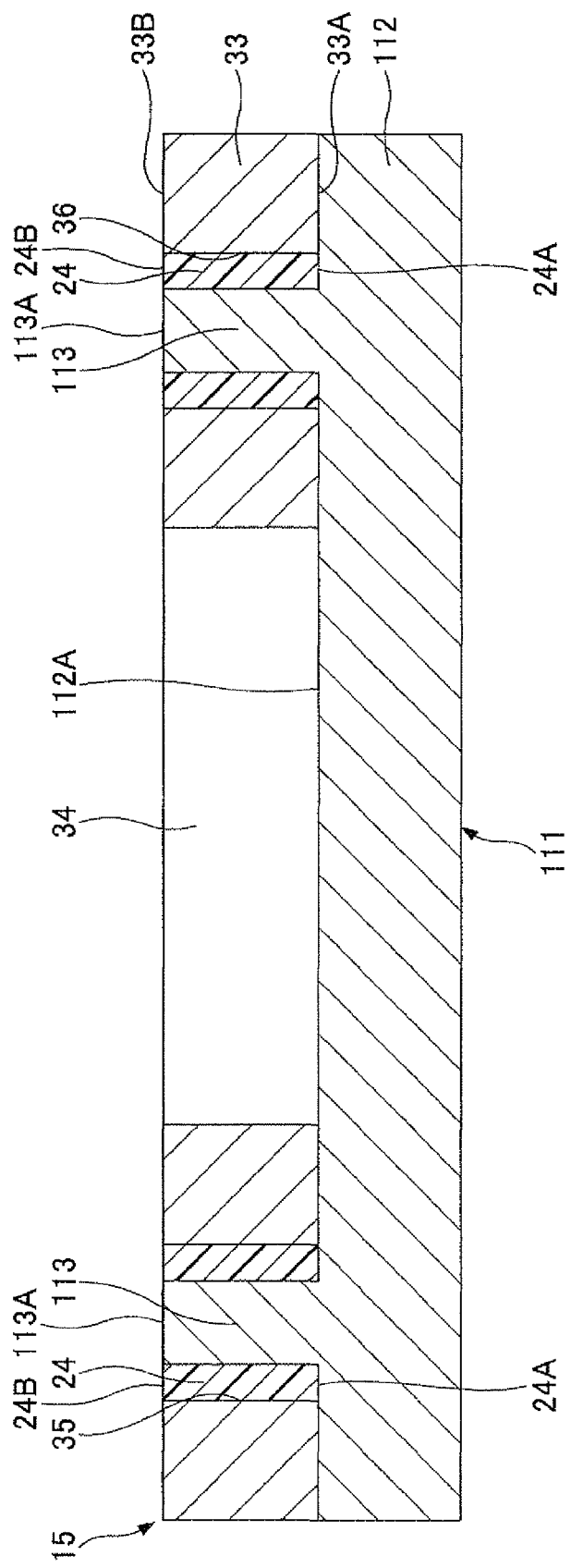
FIG. 7 illustrates a fifth manufacturing process of the semiconductor device of the embodiment according to the present invention.

In a first sealing resin forming step illustrated in FIG. 7, the gaps between the through holes 35 and 36 and the periphery of the protruding portion 113 are filled with an insulating resin. Then, the first sealing resin 24 having the first flat face 24A, which is substantially even with respect to the multi-layered wiring structure forming face 33A, is formed.

Specifically, the first sealing resin 24 is formed by filling the insulating resin (e.g. an epoxy resin) into the gaps between the through holes 35 and 36 and the protruding portion 113 by, for example, squeegee printing. At this time, the first sealing resin 24 is formed so that the second flat face 24B of the first sealing resin 24 is substantially even with the upper end face 113A of the protruding portion 113 and the face 33B of the main body 33 of the reinforcing board 15. For example, it is possible to arrange the second flat face 24B of the first sealing resin 24, the upper end face 113A of the protruding portion 113, the face 33B of the main body 33 of the reinforcing board 15 on the same plane by polishing the first sealing resin 24, the protruding portion 113 and the main body 33 of the reinforcing board 15.

Figure 8:
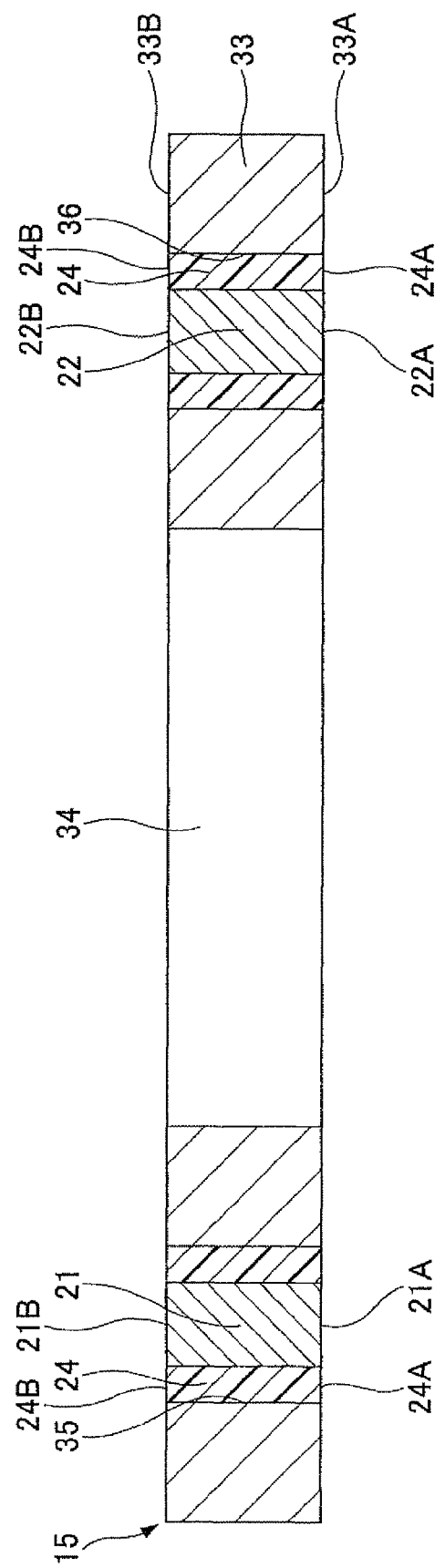
FIG. 8 illustrates a sixth manufacturing process of the semiconductor device of the embodiment according to the present invention.

In a through electrode forming step illustrated in FIG. 8, the supporting portion 112 is removed so that a lower end face of the protruding portion 113 is substantially even with the first flat face 24A of the first sealing resin 24. Then, the through electrodes 21 and 22, which use the protruding portions 113 as the base materials, are formed in the through holes 35 and 36.

Specifically, when the material of the supporting member 111 for forming the through electrodes is Cu, only the supporting body 112 is etched from a side of the lower face of the structure illustrated in FIG. 7. The etching is, for example, wet etching. Then, the through electrodes 21 and 22 are formed in a cylindrical column shape.

It is possible to make planar, when necessary, the lower face of the structure illustrated in FIG. 8 by polishing the lower face of the structure illustrated in FIG. 8 after the above etching.

Figure 9:
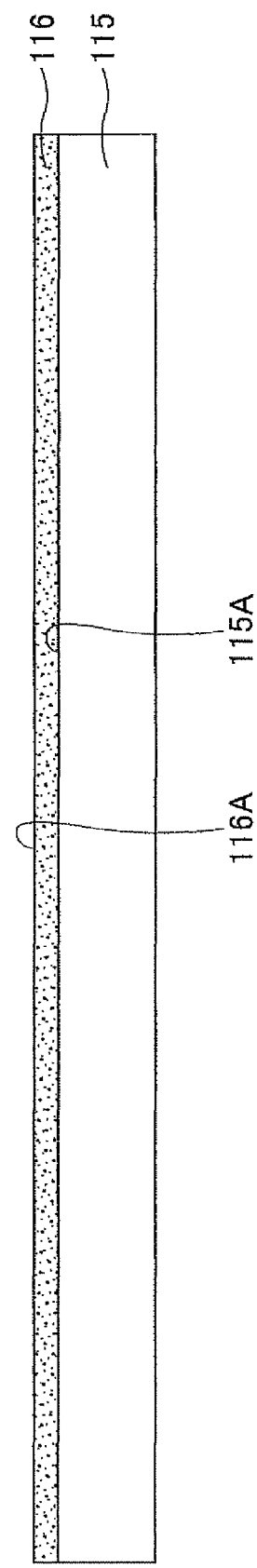
FIG. 9 illustrates a seventh manufacturing process of the semiconductor device of the embodiment according to the present invention.

Subsequently, in an adhesion layer forming step illustrated in FIG. 9, an adhesive layer 116 is formed on a face of a supporting body 115 in a plate-like shape.

The supporting body 115 is, for example, a silicon substrate, a metallic plate, e.g. a Cu plate, a glass plate or the like. The thickness of the supporting body 115 is, for example, 200 to 300 µm. The adhesive layer 116 is, for example, a die attach film having a thickness of, for example, 100 µm.

Figure 10:
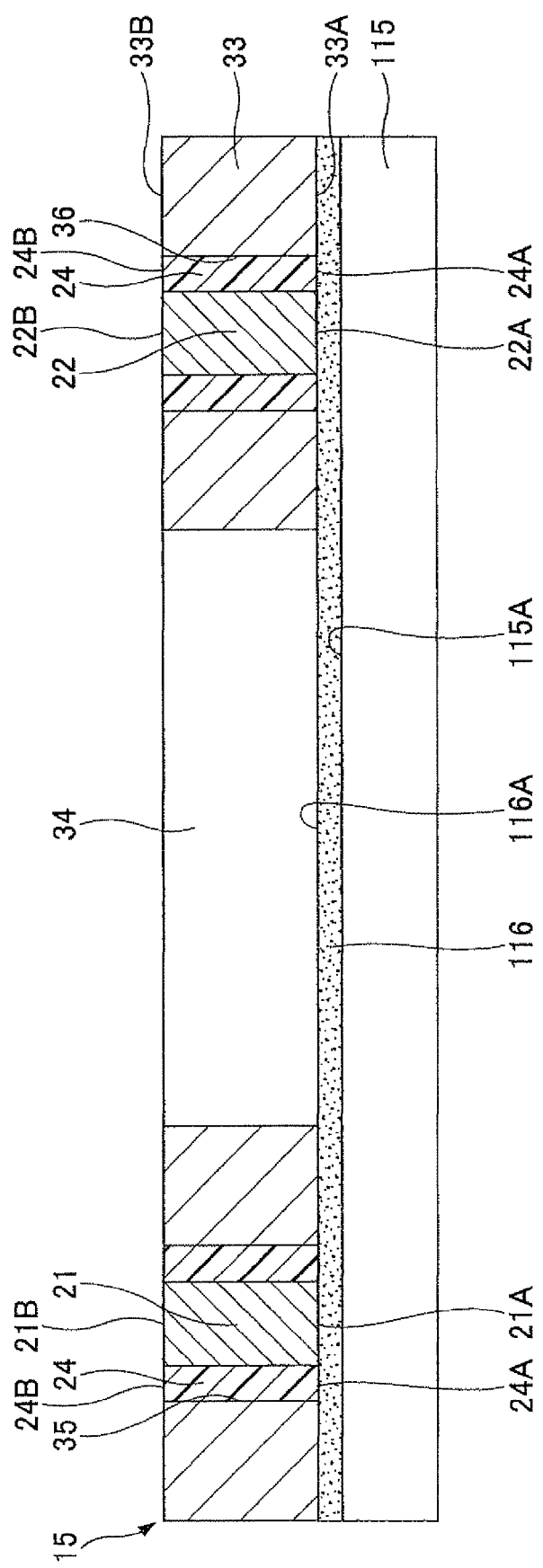
FIG. 10 illustrates an eighth manufacturing process of the semiconductor device of the embodiment according to the present invention.

In a reinforcing board adhering step illustrated in FIG. 10, the reinforcing board 15 (i.e. the structure illustrated in FIG. 8) having the through electrodes 21 and 22 and the first sealing resin 24 formed thereon is adhered to the supporting body 115 via the adhesive layer 116. At this time, a second face 116A of the adhesive layer 116 is in contact with the first bonding faces 21A and 22A of the through electrodes 21 and 22 (corresponding to the lower end surfaces of the through electrodes 21 and 22), a multi-layered wiring structure forming face 33A, and the first flat faces 24A of the first sealing resin 24.

Figure 11:
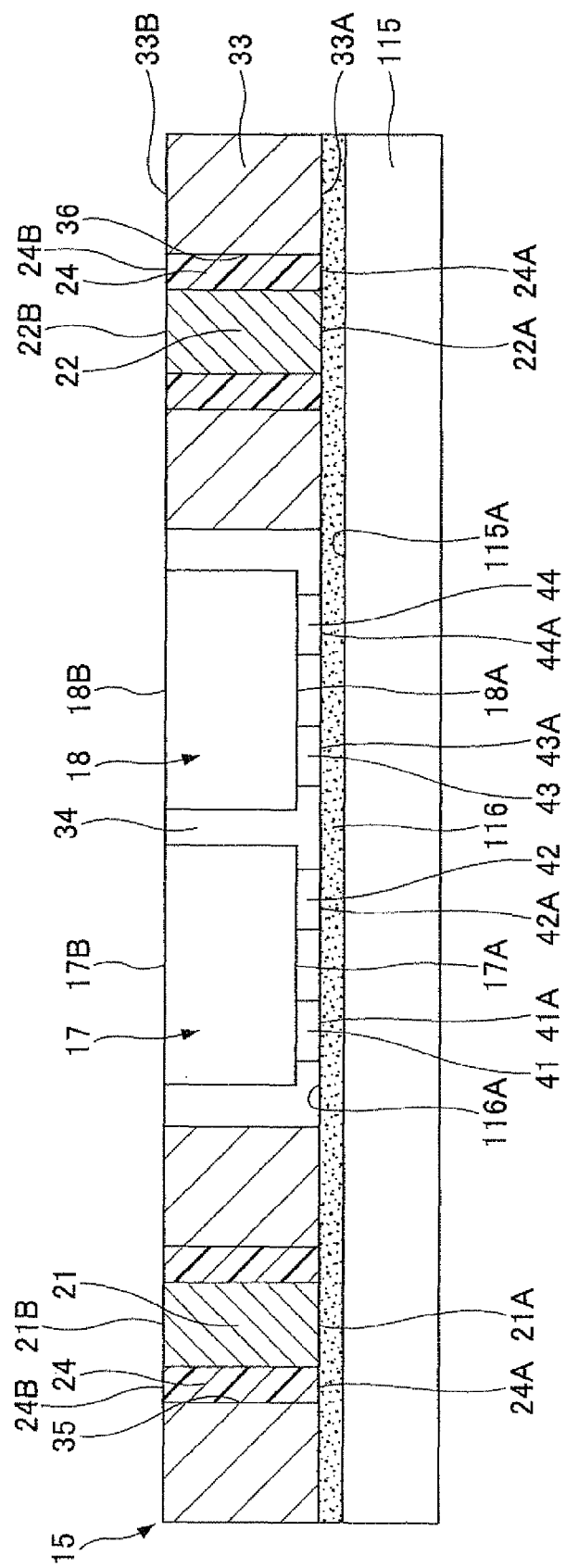
FIG. 11 illustrates a ninth manufacturing process of the semiconductor device of the embodiment according to the present invention.

In an electronic part accommodating step illustrated in FIG. 11, the electronic parts 17 and 18 are accommodated in the electronic part accommodating portion 34 so that the second face 116A of the adhesive layer 116 exposed from the electronic part accommodating portion 34 is enabled to be in contact with the bonding faces 41A, 42A, 43A and 44A.

At this time, the bonding faces 41A, 42A, 43A and 44A of the electronic parts 17 and 18 are arranged on a plane surface formed by the multi-layered wiring structure forming face 33A, the first bonding faces 21A and 22A of the through electrodes 21 and 22, and the first flat face 24A of the first sealing resin 24. Simultaneously, the back faces 17B and 18B of the electronic parts 17 and 18 are arranged on a plane surface formed by the face 33B of the main body of the reinforcing board 15, the second bonding faces 21B and 22B of the through electrodes 21 and 22, and the second flat face 24B of the first sealing resin 24.

Figure 12:
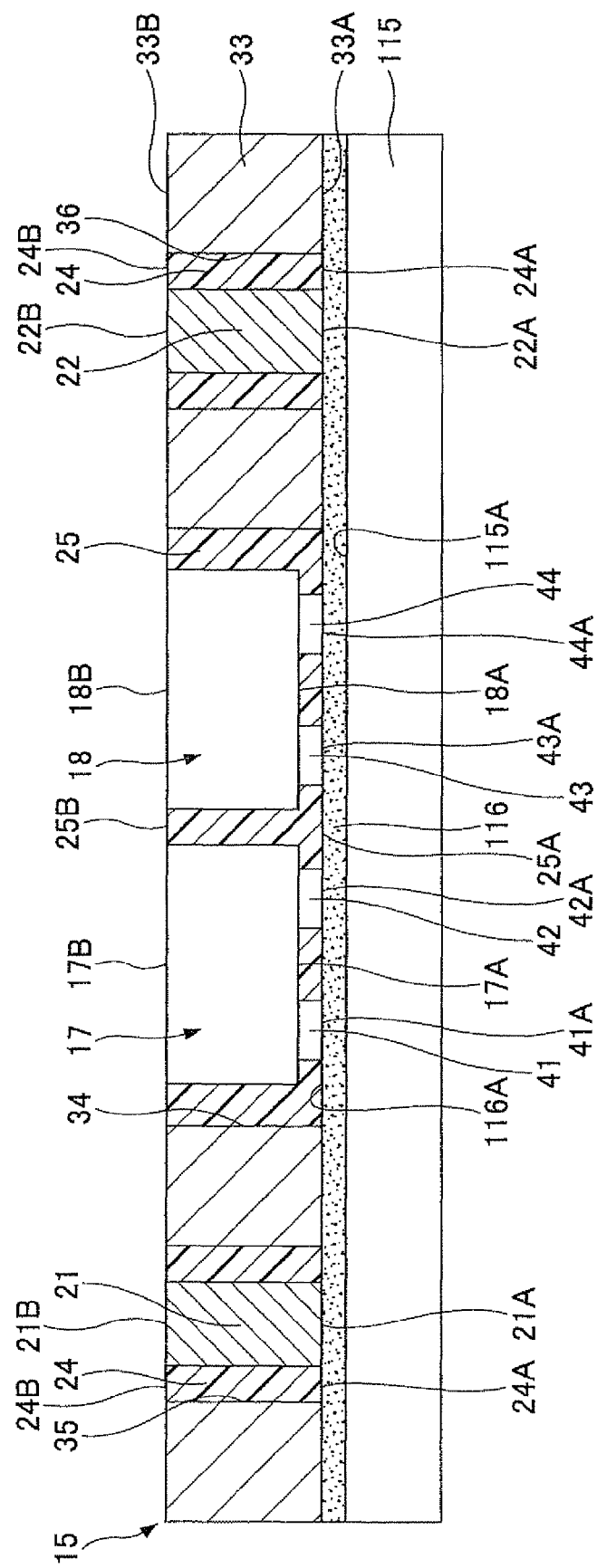
FIG. 12 illustrates a tenth manufacturing process of the semiconductor device of the embodiment according to the present invention.

In a second sealing resin forming step illustrated in FIG. 12, the second sealing resin 25, which includes the first flat face 25A and the second flat face 25B and seals side faces and the electrode pad forming faces 17A and 18A of the electronic parts 17 and 18, is formed in the electronic part accommodating portion 34. The first flat face 25A is substantially even with the multi-layered wiring structure forming face 33A, and the second flat face 25B is substantially even with the face 33B of the main body 33 of the reinforcing board 15.

As described, the multi-layered wiring structure forming face 33A, the first bonding faces 21A and 22A, the first flat face 24A, the first flat face 25A, and the bonding faces 41A, 42A, 43A and 44A are arranged on the substantially same plane. Therefore, the multi-layered wiring structure 27 may be accurately formed on the multi-layered wiring structure forming face 33A, the first bonding faces 21A and 22A, the first flat face 24A, the first flat face 25A, and the bonding faces 41A, 42A, 43A and 44A.

By arranging the face 33B, the second bonding faces 21B and 22B, the second flat face 24B, the second flat face 25B, and the back faces 17B and 18B on the same plane, said differently by make planar the face of the first semiconductor device 11 on a side installing the second semiconductor device 12, it becomes possible, when the internal connecting terminal 13 is shaped like a sphere, to reduce a spherical diameter of the internal connecting terminal 13 electrically connecting the first semiconductor device 11 and the second semiconductor device 12. Therefore, it is possible to reduce the thickness of the electronic device 10 to downsize the electronic device 10.

Further, when the spherical diameter of the internal connecting terminal 13 is reduced, it becomes possible to arrange the through electrodes 21 and 22 at small pitches. Therefore, it becomes possible to increase the number of terminals of the first semiconductor device 11 and 12.

Further, by arranging the through electrodes 21 and 22 at the small intervals, it is possible to reduce the sizes of the first semiconductor device 11 and 12 and the electronic device 10 along directions of the faces of the electronic device 10 to downsize the electronic device 10.

Figure 13:
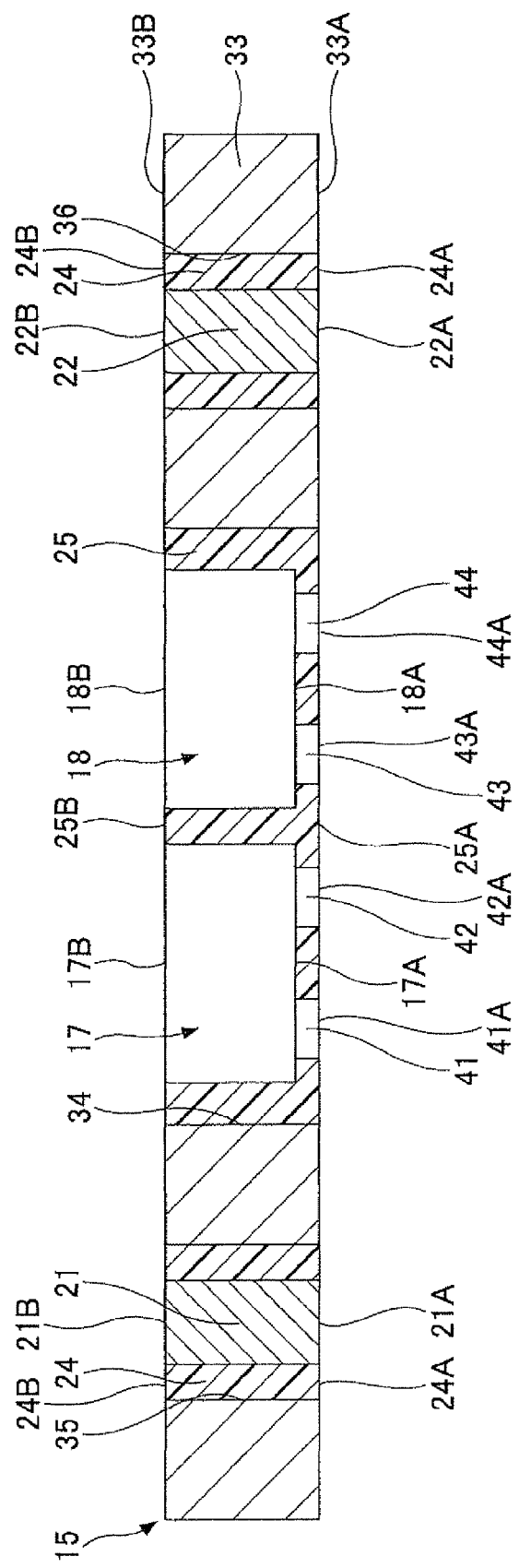
FIG. 13 illustrates an eleventh manufacturing process of the semiconductor device of the embodiment according to the present invention.

In a supporting body and adhesion layer removing step illustrated in FIG. 13, the supporting body 115 and the adhesive layer 116 are removed.

For example, the supporting body 115 and the adhesion layer 116 are removed by mechanically applying a force to peel off the supporting body 115 from the reinforcing board 15.

Figure 14:
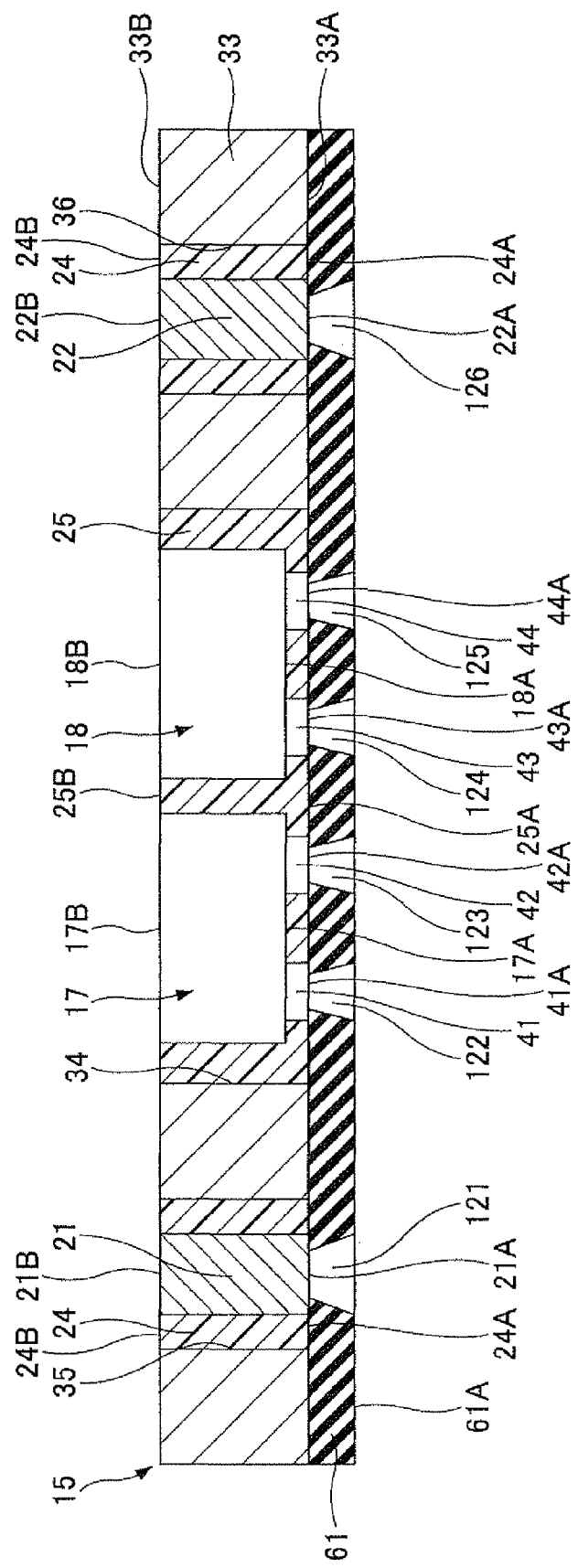
FIG. 14 illustrates an twelfth manufacturing process of the semiconductor device of the embodiment according to the present invention.

In a step illustrated in FIG. 14, the insulating layer 61 having opening portions 121 to 126 is formed on the multi-layered wiring structure forming face 33A, the first bonding faces 21A and 22A, the first flat face 24A, the first flat face 25A, and the bonding faces 41A, 42A, 43A and 44A of the electronic parts 17 and 18, which are arranged on the same plane.

For example, the insulating layer 61 is formed by adhering a resin film, which is made of an epoxy resin, is a base material of the insulating layer 61, and has a thickness of, for example, 5 thru 30 µm, to the multi-layered wiring structure forming face 33A, the first bonding faces 21A and 22A, the first flat face 24A, the first flat face 25A, and the bonding faces 41A, 42A, 43A and 44A. Then, a laser beam is emitted to the resin film at a portion corresponding to regions where the opening portions 121 thru 126 are formed.

The opening portion 121 is formed to expose the first bonding face 21A of the through electrode 21 to the outside. The opening portion 122 is formed to expose the bonding face 41A of the electrode pad 41 to the outside. The opening portion 123 is formed to expose the bonding face 42A of the electrode pad 42 to the outside. The opening portion 124 is formed to expose the bonding face 43A of the electrode pad 43 to the outside. The opening portion 125 is formed to expose the bonding face 44A of the electrode pad 44 to the outside. The opening portion 126 is formed to expose the first bonding face 22A of the through electrode 22 to the outside.

Figure 15:
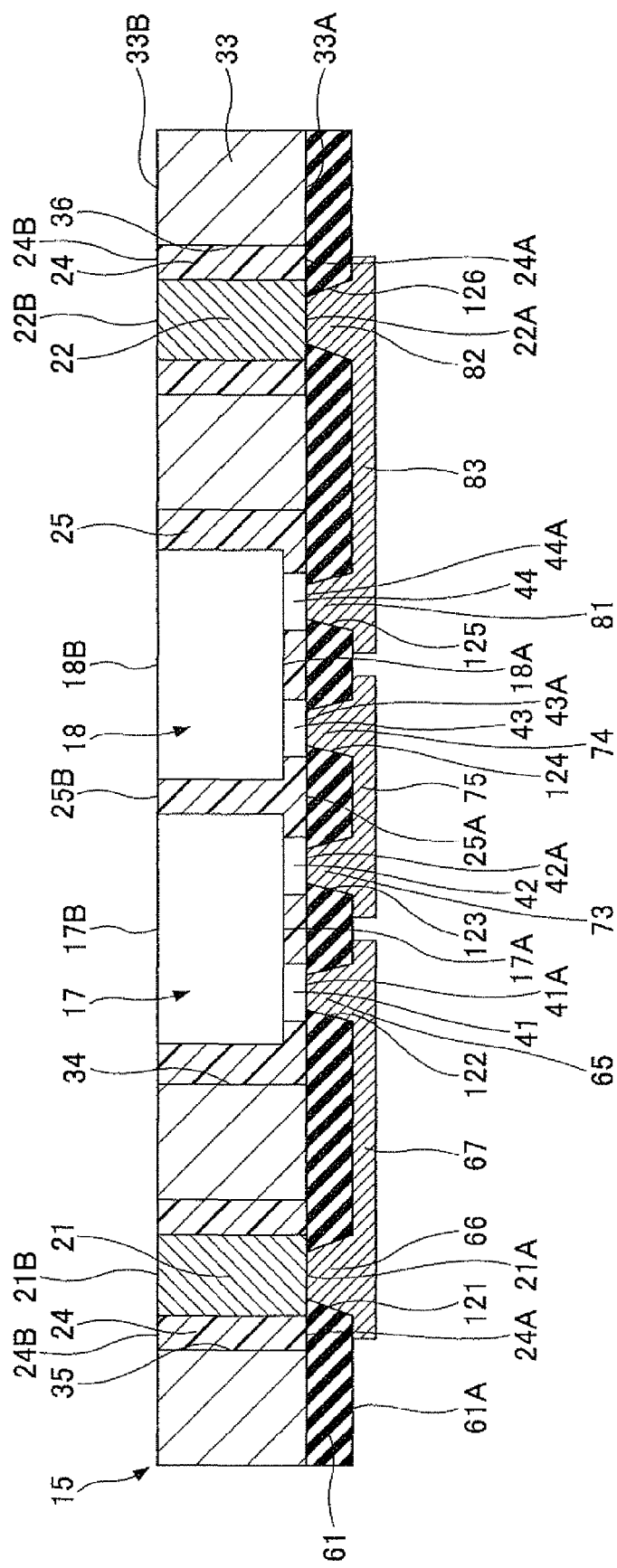
FIG. 15 illustrates a thirteenth manufacturing process of the semiconductor device of the embodiment according to the present invention.

In a step illustrated in FIG. 15, the vias 65, 66, 73, 74, 81 and 82 and the interconnection 67, 75 and 83 are simultaneously formed. The vias 65, 66, 73, 74, 81 and 82 and the interconnection 67, 75 and 83 are formed by, for example, a semi-additive method. The materials of the vias 65, 66, 73, 74, 81 and 82 and the interconnection 67, 75 and 83 are, for example, Cu.

The via 65, constituting the interconnection pattern 51, is formed in the opening portion 122 to be connected to the bonding face 41A of the electrode pad 41. The via 66 is formed in the opening portion 121 to be connected to the first bonding face 21A of the through electrode 21. The interconnection 67 is formed on the face 61A of the insulating layer 61 to be integrally formed with the vias 65 and 66.

The via 73, constituting the interconnection pattern 52, is formed in the opening portion 123 to be connected to the bonding face 42A of the electrode pad 42. The via 74, constituting the interconnection pattern 52, is formed in the opening portion 124 to be connected to the bonding face 43A of the electrode pad 43. The interconnection 75 is formed on the face 61A of the insulating layer 61 to be integrally formed with the vias 73 and 74.

The via 81, constituting the interconnection pattern 53, is formed in the opening portion 125 to be connected to the bonding face 44A of the electrode pad 44. The via 82 is formed in the opening portion 126 to be connected to the first bonding face 22A of the through electrode 22. The interconnection 83 is formed on the face 61A of the insulating layer 61 to be integrally formed with the vias 81 and 82.

In this way, it is possible to reduce the thickness of the first semiconductor device 11 in comparison with a case where the electronic parts 17 and 18 are connected to the multi-layered wiring structure 27 via bumps or metallic wires by directly connecting the interconnection pattern 51 to 53 of the multi-layered wiring structure 27 to the electrode pad 41 to 44 of the electronic parts 17 and 18.

Figure 16:
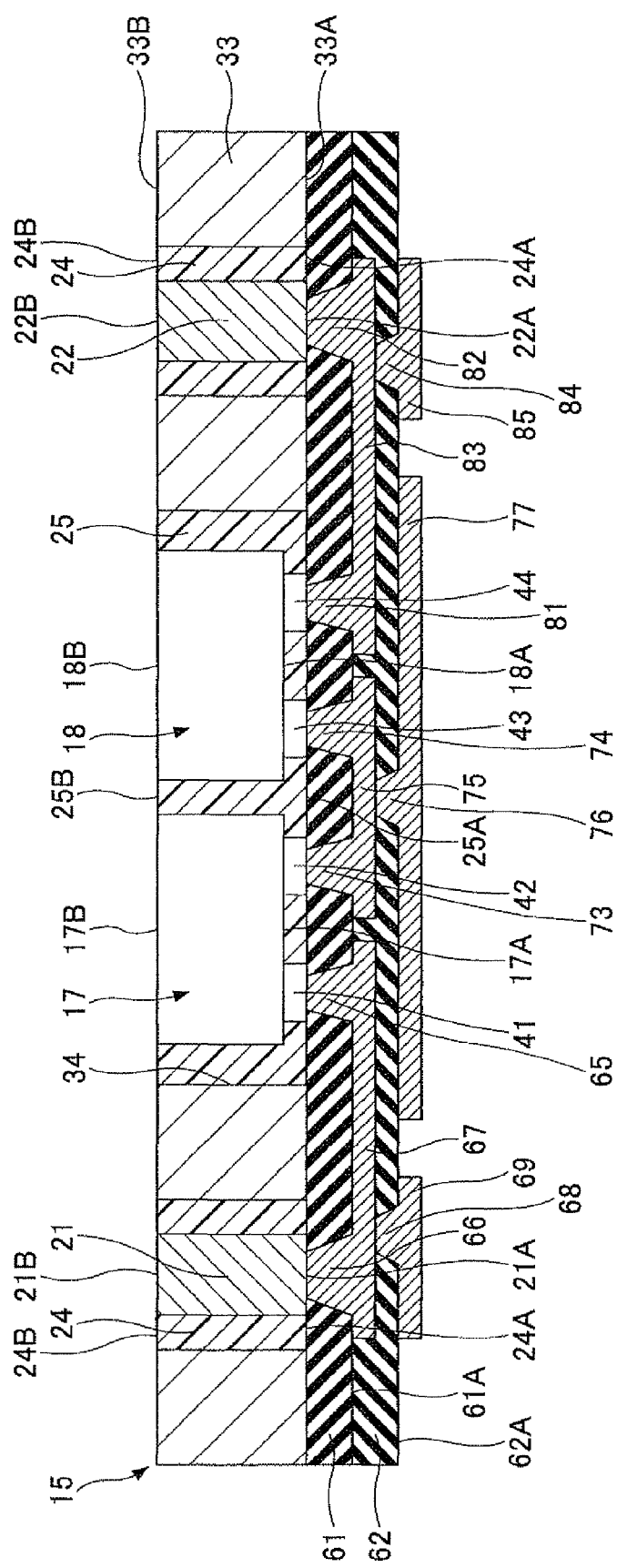
FIG. 16 illustrates a fourteenth manufacturing process of the semiconductor device of the embodiment according to the present invention.

In a step illustrated in FIG. 16, by carrying out steps similar to those described with reference to FIG. 14 and FIG. 15, the insulating layer 62, the vias 68, 76 and 84, and the interconnections 69, 77 and 85 are sequentially formed.

The interconnection 69 is electrically connected to the interconnection 67 by way of the via 68. The interconnection 77 is electrically connected to the interconnection 75 by way of the via 76. The interconnection 85 is electrically connected to the interconnection 83 by way of the via 84.

The material of the insulating layer 62 is, for example, an epoxy resin. The thicknesses of the insulating layer 62 are, for example, 5 thru 30 µm. The materials of the vias 68, 76 and 84 and the interconnection 69, 77 and 85 are, for example, Cu.

Figure 17:
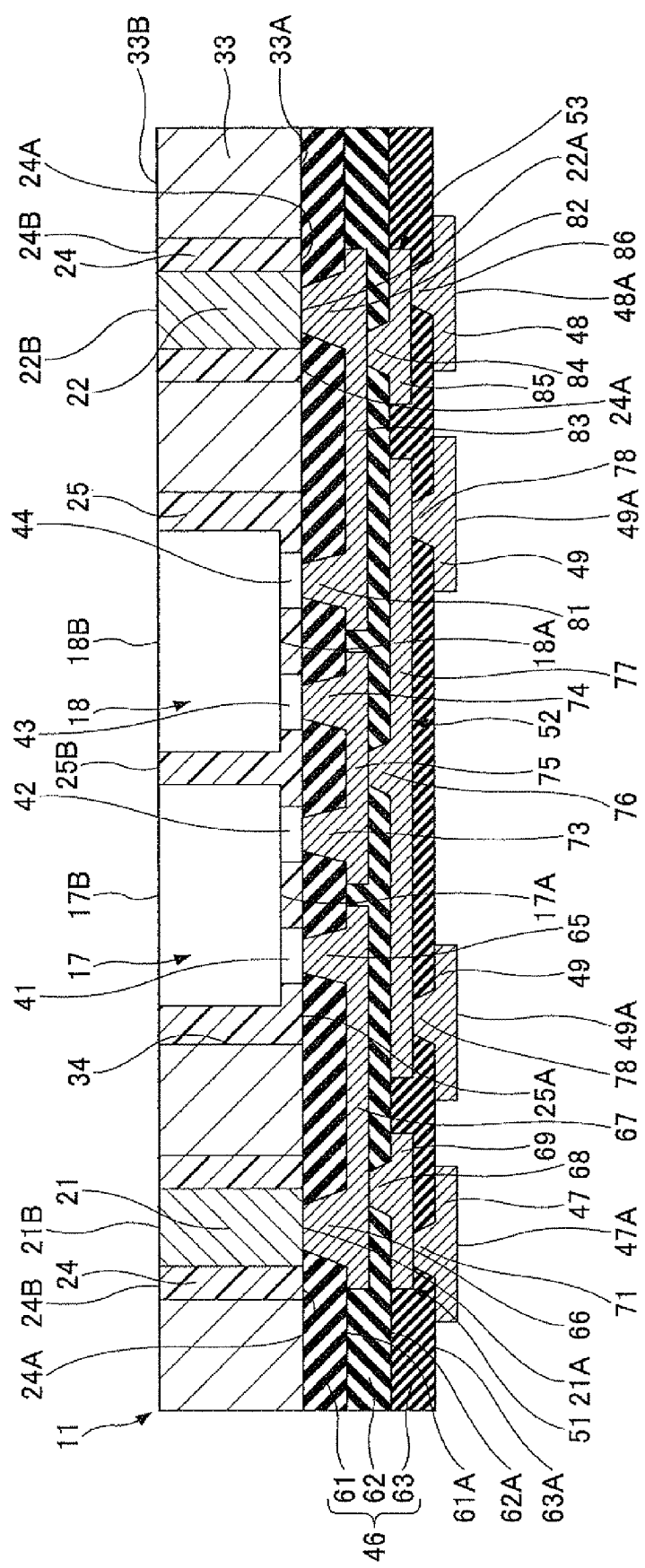
FIG. 17 illustrates a fifteenth manufacturing process of the semiconductor device of the embodiment according to the present invention.

In a step illustrated in FIG. 17, by carrying out the step similar to that described with reference to FIG. 14, the insulating layer 63 is formed on the face 62A of the insulating layer 62. Then, the laminated body 46 formed by sequentially laminating the insulating layer 61, the insulating layer 62, and the insulating layer 63 is formed. The material of the insulating layer 63 is, for example, an epoxy resin. The thickness of the insulating layer 63 is, for example, 5 thru 30 μm.

By carrying out the step similar to that described with reference to FIG. 15, external connection pads 47 to 49 having the vias 71, 78 and 86 and the bonding faces 47A, 48A and 49A are simultaneously formed. With this, the interconnection patterns 51 to 53 installed in the laminated body 46 are formed.

The external connection pad 47 is electrically connected to the interconnection 69 by way of the via 71. The external connection pad 48 is electrically connected to the interconnection 85 by way of the via 86. The external connection pad 49 is electrically connected to the interconnection 77 by way of the via 78.

Materials of the vias 71, 78 and 86, and the external connection pads 47 to 49 are, for example, Cu.

Figure 18:
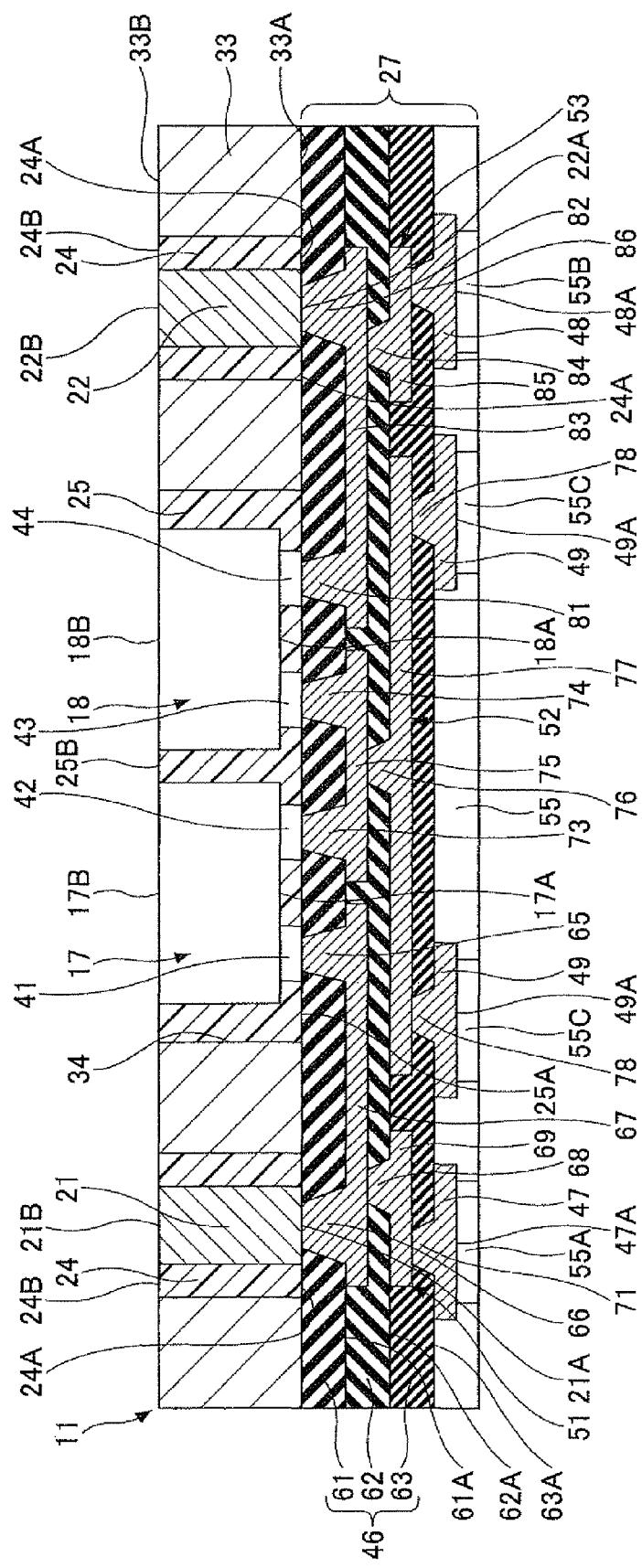
FIG. 18 illustrates a sixteenth manufacturing process of the semiconductor device of the embodiment according to the present invention.

In a step illustrated in FIG. 18, the solder resist layer 55 having opening portions 55A, 55B and 55C is formed on the face 63A of the insulating layer 63. The opening portion 55A is formed to expose the bonding face 47A of the electrode pad 47 to the outside. The opening portion 55B is formed to expose the bonding face 48A of the electrode pad 48 to the outside. The opening portion 55C is formed to expose the bonding face 49A of the electrode pad 49 to the outside. With this, the multi-layered wiring structure 27 is formed.

In this way, the through holes 35 and 36 penetrating through the main body 33 of the reinforcing board 15 at the portions in the periphery of the electronic part accommodating portion 34 accommodating the electronic parts 17 and 18 are formed.

Further, the through electrodes 21 and 22 are electrically connected to the electronic parts 17 and 18, and the multi-layered wiring structure 27 is formed in the through holes 35 and 36.

Furthermore, the multi-layered wiring structure 27 is formed on the multi-layered wiring structure forming face 33A, the first bonding faces 21A and 22A of the through electrodes 21 and 22, the first flat face 24A of the first sealing resin 24, the first flat face 25A of the second sealing resin 25, and the bonding faces 41A, 42A, 43A and 44A of the electronic parts 17 and 18.

Furthermore, the interconnection patterns 51 to 53 of the multi-layered wiring structure 27 connect the first bonding faces 21A and 22A to the electrode pads 41 to 44.

Thus, the second semiconductor device 12 overlaps the first semiconductor device 11 including the reinforcing board 15, and the first semiconductor device 11 and the second semiconductor device 12 are electrically connected via the internal connecting terminals 13 connected to the second bonding faces 21B and 22B of the through electrodes 21 and 22. Thus, the packaging density may be improved.

Figure 19:
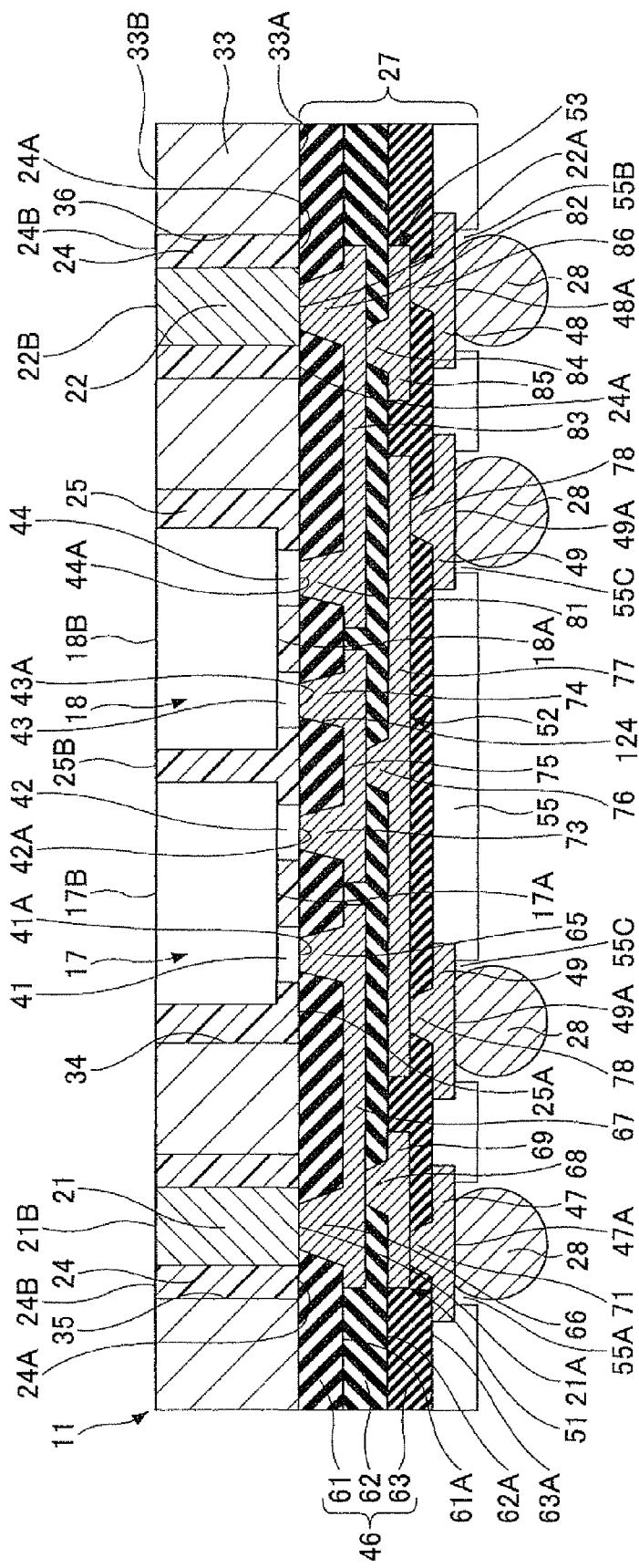
FIG. 19 illustrates a seventeenth manufacturing process of the semiconductor device of the embodiment according to the present invention.

In a step illustrated in FIG. 19, each of the bonding faces 47A, 48A and 49A is connected to a corresponding one of the external connection terminals 28. With this, the first semiconductor device 11 of the embodiment is manufactured. For example, the external connection terminal 28 is a conductive ball like a solder ball.

With the manufacturing method of the semiconductor device of the embodiment, the reinforcing board 15 having the substantially same thickness of the main body 33, the electronic part accommodating portion 34, and the through holes 35 and 36 is formed.

Further, the supporting member 111 for forming the through electrodes including the supporting portion 12 and the protruding portion 113 (through electrodes 21 and 22) is formed.

Furthermore, the reinforcing board 15 is mounted on the supporting member 111 so that the protruding portions 113 are inserted into the through holes 35 and 36.

Furthermore, the first sealing resin 24 is formed in the gaps between the through holes 35 and 36 and the peripheries of the protruding portions 113, and the supporting portion 112 is removed, to thereby form the through electrodes 21 and 22 in the through holes 35 and 36.

Furthermore, the electronic parts 17 and 18 are accommodated in the electronic part accommodating portion 34.

Furthermore, the second sealing resin 25 is formed to seal gaps between the electronic parts 17 and 18 in the electronic part accommodating portion 34.

Furthermore, the multi-layered wiring structure 27 is formed on the multi-layered wiring structure forming face 33A, the first bonding faces 21A and 22A of the through electrodes 21 and 22, the first flat face 24A of the first sealing resin 24, the first flat face 25A of the second sealing resin 25, and the bonding faces 41A, 42A, 43A and 44A of the electronic parts 17 and 18, which are arranged on the same plane.

Furthermore, the interconnection patterns 51 to 53 of the multi-layered wiring structure 27 are connected to the first bonding faces 21A and 22A and the electrode pads 41 to 44.

Then, the second semiconductor device 12 overlaps the first semiconductor device 11 including the reinforcing board 15. The first semiconductor device 11 is electrically connected to the second semiconductor device 12 via the internal connecting terminals 13 connected to the second bonding faces 21B and 22B of the through electrodes 21 and 22. Thus, the packaging density may be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiment of the present invention has been described in detail, it should be understood that the various changes, substitutions, and alterations could be made hereto without departing from the spirit and scope of the invention.

What is claimed is:

1. A semiconductor device comprising:
    a reinforcing board having a first face and a second face;
    an electronic part accommodating portion configured to penetrate the reinforcing board;
    a through hole configured to penetrate the reinforcing board;
    an electronic part configured to have a front face on which an electrode pad is formed and a back face, and be accommodated into the electronic part accommodating portion;
    a through electrode configured to be installed inside the through hole;
    a first sealing resin configured to fill a gap between the through electrode and an inner wall of the through hole;
    a second sealing resin configured to be filled into the electronic part accommodating portion while causing a bonding face of the electrode pad of the electronic part accommodating portion to be exposed to an outside; and
    a multi-layered wiring structure configured to include insulating layers laminated on the first face of the reinforcing board and an interconnection pattern,
    wherein the interconnection pattern is directly connected to the electrode pad of the electronic part and the through electrode, the second sealing resin is configured to cover the electronic part inside the electronic part accommodating portion while causing the bonding face of the electrode pad to be exposed to the outside, the through electrode has a first bonding face arranged on the first face of the reinforcing board, and the bonding face of the electrode pad, the first face of the reinforcing board, the first bonding face of the through electrode, and a first face of the second sealing resin and a face of the first sealing resin positioned on the first bonding face of the through electrode are arranged on one plane where the electrode pad and the through electrode are directly connected.

2. The semiconductor device according to claim 1, further comprising:

an external connection pad formed under the insulating layer positioned on a bottom of the multi-layered wiring structure, wherein the through electrode is electrically connected to the external connection ad via the interconnection pattern, and wherein an end surface of the through electrode forms a connection surface.

3. The semiconductor device according to claim 1, wherein the second sealing resin has a second face of the second sealing resin from which the back face of the electronic part is exposed to the outside, the through electrode has a second bonding face positioned on the second face of the reinforcing board, and the back face of the electronic part, the second face of the reinforcing board, the second bonding face of the through electrode, the second face of the second sealing resin and a face of the first sealing resin positioned on the second bonding face of the through electrode are arranged substantially on another one plane.

4. An electronic device comprising:

a semiconductor device including a reinforcing board having a first face and a second face;

an electronic part accommodating portion configured to penetrate the reinforcing board, a through hole configured to penetrate the reinforcing board, an electronic part configured to have a front face on which an electrode pad is formed and a back face, and be accommodated into the electronic part accommodating portion;

a through electrode configured to be installed inside the through hole, a first sealing resin configured to fill a gap between the through electrode and an inner wall of the through hole, a second sealing resin configured to be filled into the electronic part accommodating portion while causing a bonding face of the electrode pad of the electronic part accommodating portion to be exposed to an outside, and a multi-layered wiring structure configured to include insulating layers laminated on the first face of the reinforcing board and an interconnection pattern; and another semiconductor device electrically connected to the semiconductor device via an internal connecting terminal, wherein the interconnection pattern is directly connected to the electrode pad of the electronic part and the through electrode, the second sealing resin is configured to cover the electronic part inside the electronic part accommodating portion while causing the bonding face of the electrode pad to be exposed to the outside, the through electrode has a first bonding face arranged on the first face of the reinforcing board, and the bonding face of the electrode pad, the first face of the reinforcing board, the first bonding face of the through electrode, and a first face of the second sealing resin and a face of the first sealing resin positioned on the first bonding face of the through electrode are arranged on one plane where the electrode pad and the through electrode are directly connected.

5. The electronic device according to claim 4, further comprising:

an external connection pad formed under the insulating layer positioned on a bottom of the multi-layered wiring structure, wherein the through electrode is electrically connected to the external connection pad via the interconnection pattern, and wherein an end surface of the through electrode forms a connection surface.

6. The electronic device according to claim 4, wherein the second sealing resin has a second face of the second sealing resin from which the back face of the electronic part is exposed to the outside, the through electrode has a second bonding face positioned on the second face of the reinforcing board, and the back face of the electronic part, the second face of the reinforcing board, the second bonding face of the through electrode, the second face of the second sealing resin and a face of the first sealing resin positioned on the second bonding face of the through electrode are arranged substantially on another one plane.

* * * * *